US011011442B2

(12) United States Patent
Taya

(10) Patent No.: US 11,011,442 B2
(45) Date of Patent: May 18, 2021

(54) POWER MODULE

(71) Applicant: Mitsubishi Electric Corporation, Chiyoda-ku (JP)

(72) Inventor: Masaki Taya, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 18 days.

(21) Appl. No.: 15/554,634

(22) PCT Filed: Feb. 19, 2016

(86) PCT No.: PCT/JP2016/054903
§ 371 (c)(1),
(2) Date: Aug. 30, 2017

(87) PCT Pub. No.: WO2016/158072
PCT Pub. Date: Oct. 6, 2016

(65) Prior Publication Data
US 2018/0068918 A1 Mar. 8, 2018

(30) Foreign Application Priority Data

Mar. 27, 2015 (JP) .............................. JP2015-066338

(51) Int. Cl.
*H01L 23/24* (2006.01)
*H01L 23/16* (2006.01)
(Continued)

(52) U.S. Cl.
CPC ............ *H01L 23/24* (2013.01); *H01L 23/053* (2013.01); *H01L 23/10* (2013.01); *H01L 23/16* (2013.01);
(Continued)

(58) Field of Classification Search
CPC ......... H01L 2924/181; H01L 2924/351; H01L 23/3107; H01L 23/36; H01L 21/4871;
(Continued)

(56) References Cited

U.S. PATENT DOCUMENTS 6,087,682 A * 7/2000 Ando .................. H01L 24/72
257/177
6,791,174 B2 9/2004 Matsuo et al.
(Continued)

FOREIGN PATENT DOCUMENTS

JP 62-122246 A 6/1987
JP 01-108901 U 7/1989
(Continued)

OTHER PUBLICATIONS

International Search Report dated May 10, 2016 in PCT/JP2016/054903, filed Feb. 19, 2016.
(Continued)

*Primary Examiner* — Vincent Wall
(74) *Attorney, Agent, or Firm* — Xsensus LLP

(57) ABSTRACT

A power module will be provided which can suppress insulation performance deterioration caused by heat cycle to ensure insulation performance, by suppressing generation of bubbles and occurrence of detachments between silicone gel and an insulating substrate at a high or low temperature or at a high working voltage. The power module includes: an insulating substrate 2 on a first face of which a semiconductor element 3 is provided; a base plate 1 joined to a second face of the insulating substrate 2; a case member 6 surrounding the insulating substrate 2 and being in contact with a face of the base plate 1, that is joined to the insulating place 2; sealing resin 8 filling a region surrounded by the base plate 1 and the case member 6 to seal the insulating substrate 2; a pressing plate 9 disposed in close contact with
(Continued)

a surface of the sealing resin 8 in a side of the first face of the insulating substrate 2; and a lid member 7 facing an opposite face of the pressing plate 9 with respect to a face thereof in close contact with the sealing resin 8, and being fixed to the case member 6 at a position to prevent the pressing plate 9 from ascending.

13 Claims, 23 Drawing Sheets

(51) Int. Cl.

| | | |
|---|---|---|
| *H01L 25/18* | (2006.01) | |
| *H01L 23/053* | (2006.01) | |
| *H01L 23/10* | (2006.01) | |
| *H01L 23/29* | (2006.01) | |
| *H01L 25/07* | (2006.01) | |
| *H01L 23/00* | (2006.01) | |

(52) U.S. Cl.
CPC .......... *H01L 23/296* (2013.01); *H01L 25/071* (2013.01); *H01L 25/18* (2013.01); *H01L 23/562* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48137* (2013.01); *H01L 2224/48227* (2013.01); *H01L 2224/48472* (2013.01); *H01L 2224/73265* (2013.01); *H01L 2924/13055* (2013.01); *H01L 2924/13091* (2013.01); *H01L 2924/181* (2013.01); *H01L 2924/19107* (2013.01)

(58) Field of Classification Search
CPC ... H01L 33/483; H01L 21/52; H01L 23/3675; H01L 23/3737; H01L 24/49; H01L 23/053; H01L 25/16; H01L 23/24; H01L 2224/48091; H01L 23/367; H01L 23/3735; H01L 23/38; H01L 24/48; H01L 2924/13055; H01L 2924/00; H01l 23/24; H01l 23/16
See application file for complete search history.

(56) References Cited

U.S. PATENT DOCUMENTS

| | | | | |
|---|---|---|---|---|
| 8,319,335 | B2 * | 11/2012 | Bayerer | ............ H01L 23/49562 257/717 |
| 2003/0011057 | A1 * | 1/2003 | Nakajima | ............... H01L 23/16 257/678 |
| 2003/0089974 | A1 * | 5/2003 | Matsuo | .................. H01L 23/16 257/693 |
| 2003/0146499 | A1 * | 8/2003 | Kondo | ................ H01L 23/3733 257/675 |
| 2014/0035123 | A1 * | 2/2014 | Oka | ...................... H01L 23/367 257/712 |
| 2016/0233146 | A1 * | 8/2016 | Nakamura | .............. H01L 24/01 |

FOREIGN PATENT DOCUMENTS

| | | |
|---|---|---|
| JP | 01-108951 U | 7/1989 |
| JP | 05-121881 A | 5/1993 |
| JP | 06-342855 A | 12/1994 |
| JP | 62-342855 A | 12/1994 |
| JP | 62-122248 A | 6/1997 |
| JP | 09-237669 A | 9/1997 |
| JP | 2000-311970 A | 11/2000 |
| JP | 2003-152136 A | 5/2003 |
| JP | 2008-288414 A | 11/2008 |
| JP | 2013-045930 A | 3/2013 |
| JP | 2013-149819 A | 8/2013 |
| JP | 2014-130875 A | 7/2014 |
| JP | 2014-150203 A | 8/2014 |
| JP | 2014-150204 A | 8/2014 |
| WO | 2002/059969 A1 | 8/2002 |

OTHER PUBLICATIONS

International Search Report dated May 10, 2016 in PCT/JP2016/054903, filed Feb. 19, 2018.
Combined Office Action and Search Report dated May 17, 2019 in Chinese Patent Application No. 201680017527.2 (with unedited computer generated English translation of the Office Action and English translation of categories of cited documents), 14 pages.
German Office Action dated Jan. 31, 2020 issued in corresponding German Patent Application No. 12016001427.9, 10 pages, with English Translation.

* cited by examiner

POWER MODULE

TECHNICAL FIELD

The present invention relates to a sealing structure of a power module in which power semiconductor elements are sealed with resin.

BACKGROUND ART

A semiconductor element of a certain type whose electrical path is passed in the vertical direction of the element in order to deal with a high voltage and a large current is generally called a power semiconductor element (for example, IGBT (Insulated Gate Bipolar Transistor), MOSFET (Metal Oxide Semiconductor Field Effect Transistor), bipolar transistor, and diode). Power semiconductor elements are mounted on a circuit substrate and packaged with sealing resin into a power module, which is used in a wide range of fields such as industrial machines, vehicles, and railway cars. In recent years, with advancing performance of devices equipped with the power modules, request has been growing for a high performance power module that has a higher rated voltage, a larger rated current, or an expanded operating temperature range (higher temperature, lower temperature).

With respect to the package structure of the power modules, a structure referred to as a case structure is the main stream. A case type power module has a structure in which power semiconductor elements are mounted to a heat-dissipating base plate with an insulating substrate between them, and the case is joined to the base plate. The semiconductor elements included in the power module are connected to a main electrode. Bonding wires are used to connect the power semiconductor elements and the main electrode. Generally, insulating gel-like filler typified by silicone gel is used as sealing resin for the power module in order to prevent insulation failure when a high voltage is applied.

A traditional power module is disclosed (for example, Patent Document 1) in which, in order to prevent bonding wires from fracturing due to the shaking of the silicone gel, a press lid is inserted so as to get in close contact with the upper face of the silicone gel, and protrusions are provided on the sides of the press lid to engage, movable in upward and downward direction, with the inner wall of the outer circumference case.

Also, another power module is disclosed (for example, Patent Document 2) in which a lid is included to cover the upper face of the silicone gel with the lid's end portions fixed to the case, and at lease 80% of the upper face is in contact with the lid in a usable temperature range.

PRIOR ART DOCUMENT

Patent Document

Patent Document 1: Japanese Patent Laid-Open Publication No. 2000-311970 (Page 3, FIG. 1)
Patent Document 2: Japanese Patent Laid-Open Publication No. 2014-130875 (Page 4, FIG. 1)

SUMMARY OF THE INVENTION

Problem to be Solved by the Invention

Generally, the amount of gas which can be dissolved in silicone gel becomes less as temperature increases. Therefore, the expansion of usage temperature range of power modules brings about higher usage temperature of silicone gel, causing bubbles formed by the gas which no longer can be dissolved in the silicone gel. At such spots where bubbles are generated, detachments between the silicone gel and the insulating substrate (wiring pattern) occur, causing no effect of the insulation sealing by the silicone gel and deteriorating the insulation performance of the power module.

In order to suppress generation of the bubbles and the detachments in the silicone gel, the internal stress of the silicone gel should be generated as compressive stress. This is because tensile stress serves as a driving force to generate and expand the bubbles and the detachments.

In the power module disclosed in Patent Document 1, however, even if the press lid is inserted so as to get in close contact with the upper face of the sealing resin, because the press lid is movable upward and downward along the inner wall of the outer circumference case, the thermally-expanded sealing resin can easily push up the press lid when the power semiconductor elements are operated at a high temperature. Therefore, no compressive stress is generated to suppress the generation of the bubbles, thereby deteriorating the insulation performance of the power module.

In a power module described in Patent Document 2, because the end portions of the lid are fixed to the case, the thermally-expanded silicone gel cannot push up the pressing plate at a high temperature, the internal stress of the silicone gel becomes compressive stress to suppress the bubble generation. At a low temperature, however, because the lid end portions are fixed to the case, the thermally-shrunk silicone gel is pulled by the lid, so that the internal stress becomes tensile stress. The internal tensile stress in the silicone gel expands micro bubbles therein. Also, the tensile stress creates a detachment or develops the detachment in interfaces, if there is a portion with deteriorated adhesive strength in the interface between the silicone gel and the insulating substrate, the interface between the silicone gel and the power semiconductor elements, or the interface between the gel and the wire. At the spots where the bubbles are generated or the detachment is created, the effect of the insulation sealing by the silicone gel diminishes, thereby deteriorating the insulation performance of the power module.

Further, at a higher working voltage of the power module smaller bubbles or smaller detachments can cause dielectric breakdown, resulting in deterioration of the insulation performance in the power module.

As explained so far, when the traditional power modules are used at a higher temperature or a lower temperature as the result of the expansion of the operating temperature range of the power modules, or when the traditional power modules are used at a high working voltage, the traditional power modules are deteriorated in the insulation performance.

The present invention is made to solve the above-described problem, and to provide a power module ensuring the insulation performance when used at a high temperature, at a low temperature, or at a high working voltage by suppressing the generation of bubbles and the detachments between silicone gel and an insulating substrate.

Means for Solving Problem

A power module according to the present invention includes: an insulating substrate on a first face of which a semiconductor element is provided; a base plate joined to a second face of the insulating substrate; a case member surrounding the insulating substrate and being in contact with a face of the base plate, that is joined to the insulating plate; sealing resin filling a region surrounded by the base plate and the case member to seal the insulating substrate; a pressing plate disposed in close contact with a surface of the sealing resin in a side of the first face of the insulating substrate; and a lid member facing an opposite face of the pressing plate with respect to a face thereof in close contact with the sealing resin, and being fixed to the case member at a position to prevent the pressing plate from ascending.

Effect of the Invention

According to the present invention, the pressing plate is provided between the sealing resin in the module and the lid therein so as to be in close contact with the sealing resin. This can mitigate thermal stress to be generated during heat cycles in the sealing resin filling the case and the insulating substrate, which can improve the module reliability in heat cycles.

EMBODIMENTS FOR CARRYING OUT THE INVENTION

Hereinafter, using the figures, embodiments of semiconductor devices according to the present invention will be explained in detail. Note here that the present invention is not limited to what is described below and is adequately alterable within a substantial range of the present invention.

Embodiment 1

Figure 1:
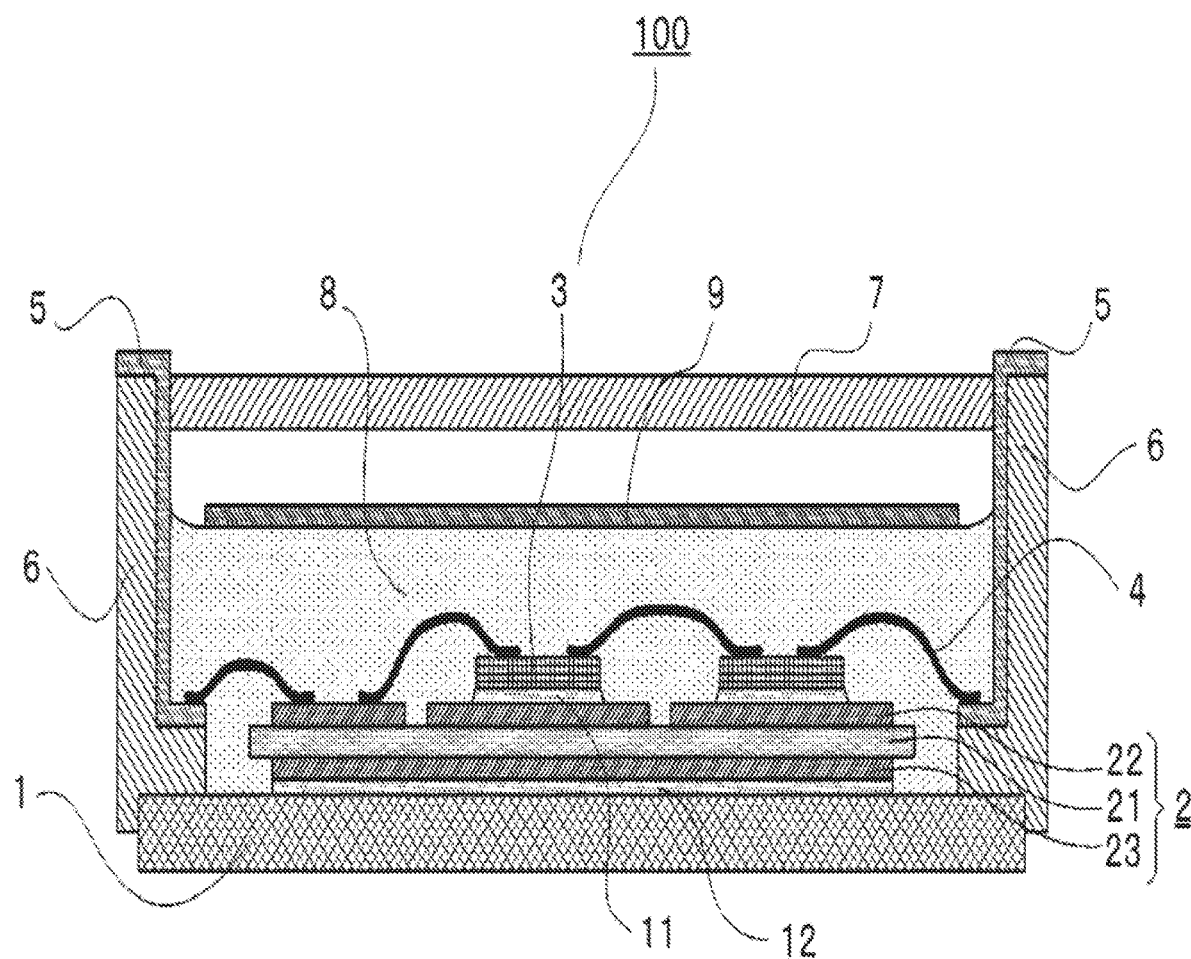
FIG. 1 is a schematic sectional view of the structure of a power module according to Embodiment 1 of the present invention.

FIG. 1 is a schematic sectional view of the structure of a power module according to Embodiment 1 of the present invention. As shown in FIG. 1, a power module 100 includes a base plate 1, an insulating substrate 2, power semiconductor elements 3 each functioning as a semiconductor element, bonding wires 4, terminals 5, a case 6 functioning as a case member, a lid 7 functioning as a lid member, silicone gel 8 which is sealing resin, a pressing plate 9, and solders 11 and 12.

The lower side face ("the other face") of the insulating substrate 2 is soldered onto the base plate 1 with the solder 12. The insulating substrate 2 includes an insulating layer 21, and metal plates 22 and 23. The insulating substrate 2 has a structure in which the metal plates 22 and 23 made of copper, aluminum, or the like are glued to both respective faces of the insulating layer 21 made of aluminum oxide, aluminum nitride, ceramic such as a silicon nitride, epoxy resin, or the like. A wiring pattern is formed on the metal plate 22 which corresponds to the upper side face ("a face") of the insulating substrate 2. The power semiconductor elements 3 are soldered onto the metal plate 23 of the upper side face with the solder 11. Solder is used here as bonding material. The bonding material to be used, however, is not limited to solder, and material or a technique such as sintered silver, conductive adhesive, or a liquid phase diffusion bonding technique may be used for the bonding.

The power semiconductor elements 3 include MOSFETs (Metal Oxide Semiconductor Field Effect Transistor), power control semiconductor elements such as IGBTs (Insulated Gate Bipolar Transistor), freewheeling diodes and the like. The power semiconductor elements 3 and the terminals 5 are electrically connected via the bonding wires 4 each of which has a wire diameter of 0.1 to 0.5 mm and is made of aluminum alloy or copper alloy. In Embodiment 1, the bonding wires 4 are used; however, bonding ribbons may be used. The terminals 5 are plate-like electrodes made of copper. The terminals 5 are formed on the case 6 through insert-molding or outsert-molding to be used for current or voltage to be inputted from or outputted to the outside of the power module 100. The case 6 is joined to the base plate 1 with adhesive (not illustrated). Generally, the case 6 is made of material such as PPS (Poly Phenylene Sulfide) resin or PBT (Poly Butylene Terephthalate) resin.

The silicone gel 8 fills the region surrounded by the case 6 and the base plate 1 to ensure the insulation performance in the inside of the power module 100. The silicone gel 8 fills the region to a level at which the power semiconductor elements 3 and the bonding wires 4 are fully immersed in the silicone gel 8.

The pressing plate 9 is disposed in close contact with a top face (upper face) of the filled silicone gel 8. Further, the lid 7 is disposed at a top portion of the case 6. The lid 7 separates the inside of the power module 100 from the outside to prevent dust and the like from entering the power module 100. The lid 7 is fixed to the case 6 with adhesive (not illustrated) or screws (not illustrated). Note that the top face of the silicone gel 8 here means the opposite face of the silicone gel 8 with respect to a face thereof in contact with the face of the insulating substrate 2.

Figure 2:
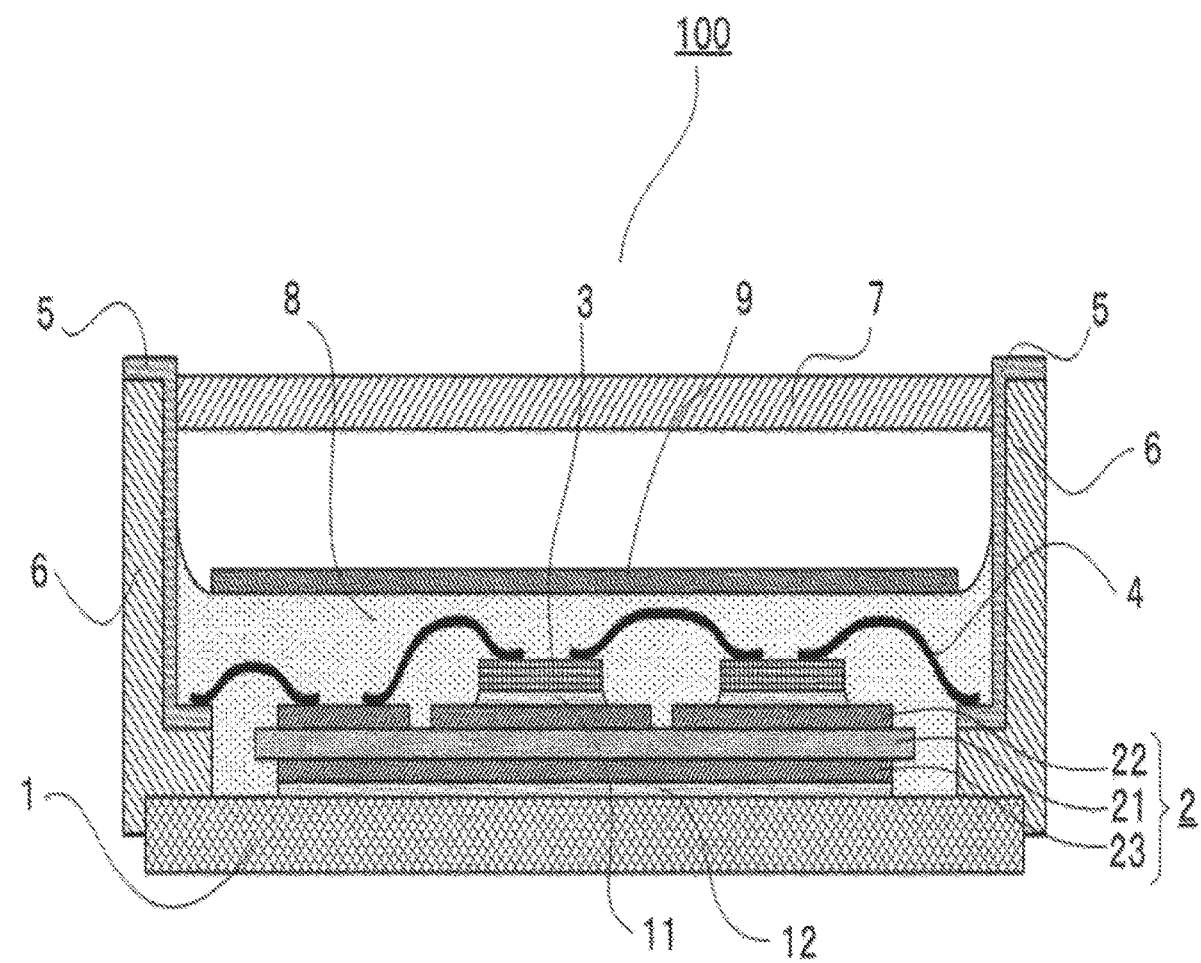
FIG. 2 is a schematic sectional view of the structure of a power module according to Embodiment 1 of the present invention, whose temperature is low.
Figure 3:
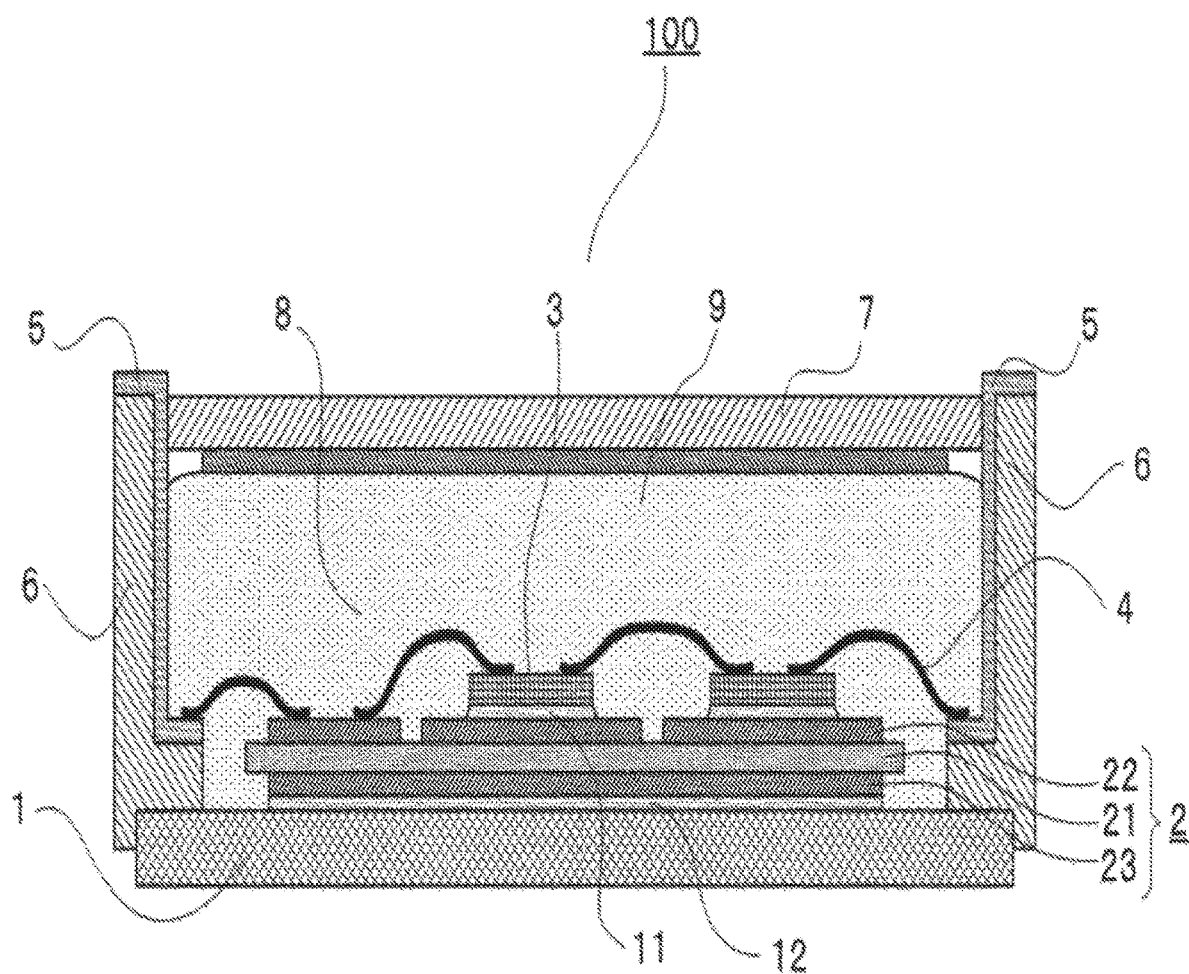
FIG. 3 is a schematic sectional view of the structure of a power module according to Embodiment 1 of the present invention, whose temperature is high.

FIG. 2 is a schematic sectional view of the structure of the power module according to Embodiment 1 of the present invention, whose temperature is low. FIG. 3 is a schematic sectional view of the structure of the power module according to Embodiment 1 of the present invention, whose temperature is high. FIG. 2 is a schematic sectional view of the internal structure of the module 100 when the temperature of the module is the normal temperature or lower. FIG. 3 is a schematic sectional view of the internal structure of the module 100 when the temperature of the module 100 is the curing temperature of the silicone gel 8 or higher.

The curing temperature of the silicone gel 8 used for insulation sealing of the power module is normally 60 to 80 degrees C. The linear expansion coefficient of the silicone gel 8 used for insulation sealing of the power module is normally 300 to 400 ppm/K. On the other hand, the linear expansion coefficients of other components used in the power module 100 are 3 to 25 ppm/K, which means that the linear expansion coefficient of the silicone gel 8 is several tens times to one hundred and several tens times larger than those of other components used in the power module 100.

Therefore, when the temperature of the power module 100 decreases to the normal temperature after completing the sealing process to cure the silicone gel 8 having filled the case 6, the silicone gel 8 shrinks more than other components. At this point, the surface level of the silicone gel 8 becomes lower than that when cured (refer to FIG. 1).

As shown in FIG. 2, when the temperature of the power module 100 becomes lower than the normal temperature, the surface level of the silicone gel 8 becomes further lower.

On the other hand, when the temperature of the power module 100 becomes higher than the curing temperature, the silicone gel 8 thermally expands more than other components, so that the surface level of the silicone gel 8 becomes, as shown in FIG. 3, higher than the position when cured.

Here, let $\Delta L$ be the height change amount of the silicone gel 8 due to temperature change, S the surface area of the silicone gel 8, V the volume of the silicone gel 8, $\beta$ the volume expansion ratio of the silicone gel 8, and $\Delta T$ the temperature change amount. Then, a relation of $\Delta L = V \times \beta \times \Delta T \times 1/S$ holds. By making the gap between the lid 7 and the lid 7-side face of the silicone gel 8 smaller than $\Delta L$, the pressing plate 9 reaches the lid 7 during an operation in which the power module 100 operates at a temperature higher than the curing temperature, so that the internal stress of the silicone gel 8 becomes compressive stress. Therefore, the gap (distance) between the lid 7 and the pressing plate 9 needs to be set smaller than $\Delta L$. For example, $\Delta L$ is set such that the pressing plate 9 reaches the lid 7 when the operating temperature of the power module 100 is 150 degrees C. or higher.

Here is a more specific example. In a power module 100 in which silicone gel 8 is used whose curing temperature is 60 degrees C., whose linear expansion coefficient is 400 ppm/K and whose height is 10 mm, V/S=10 mm and $\beta=3\times400$ ppm/K are given: in order that the internal stress of the silicone gel 8 becomes compressive stress at the power module temperature higher than 150 degrees C., it suffices that the gap between the lid 7-side face of the silicone gel 8 and the lid 7 be $\Delta L \leq (10 \text{ mm}) \times (400 \times 10^{-6} \text{K}^{-1}) \times ((150-60) \text{ degrees C.}) = 1.08 \text{ mm}$.

In the power module 100 described above, when the temperature of the power module 100 becomes lower, the pressing plate 9 is pulled down toward the base plate 1 by the thermal shrinkage of the silicone gel 8. At this time, because of being fixed neither to the case 6 nor to the lid 7, the pressing plate 9 can curve in a convex shape toward the lower side (the side of the base plate 1) according to the thermal shrinkage of the silicone gel 8. As the result, the silicone gel 8 generates almost no thermal stress, preventing the internal stress of the silicone gel 8 from becoming tensile stress. Therefore, even when the temperature of the power module 100 becomes lower, the growth of bubbles and detachments can be suppressed to suppress the detachments of the insulating substrate 2 from the silicone gel 8, consequently suppressing the insulation deterioration of the power module.

When the temperature of the power module 100 becomes higher, the pressing plate 9 is pushed up toward the lid 7 by the thermal expansion of the silicone gel 8. In this situation, when the pressing plate 9 is pushed upward to touch the lid 7, because the lid 7 is fixed to the case 6, the pressing plate 9 cannot move any further in the direction toward the lid 7, so that the position of the pressing plate 9 gets fixed. At this state, the silicone gel 8 becomes unable to thermally expand any more, and the internal stress of the silicone gel 8 becomes compressive stress. Because the internal stress of the silicone gel 8 becomes compressive stress, even when the temperature of the power module 100 becomes higher, the growth of bubbles and detachments can be suppressed to suppress the detachments of the insulating substrate 2 from the silicone gel 8, consequently suppressing the insulation deterioration of the power module.

It is desired that the pressing plate 9 be smaller than the lid 7 in the case 6, and that according to the transformation of the silicone gel 8 due to temperature change, the pressing plate be transformable (curvable) in the up-and-down direction in the sectional view in the case 6, and be of the size which allows itself to move in the up-and-down direction.

In the power module 100 configured as described above, the pressing plate is disposed between the sealing resin and the lid so as to be in close contact with the sealing resin, which thereby makes it possible to suppress the growth of bubbles and detachments caused by stress changes due to the sealing resin's expansion and shrinkage according to temperature changes of the power module 100. As the result, detachment between the sealing resin and the insulating substrate can be suppressed, which leads to improvement of the insulations reliability of the power module.

Embodiment 2

Embodiment 2 is different from Embodiment 1 in that protrusions 10 are formed on the face of a lid 7, facing the pressing plate 9. Also in a case where the protrusions 10 are formed on the face of the lid 7 facing the pressing plate 9, it is possible to suppress the growth of bubbles and detachments caused by stress changes due to the sealing resin's expansion and shrinkage. As the result, detachment between the sealing resin and the insulating substrate can be suppressed, which leads to improvement of the insulation reliability of the power module.

Figure 4:
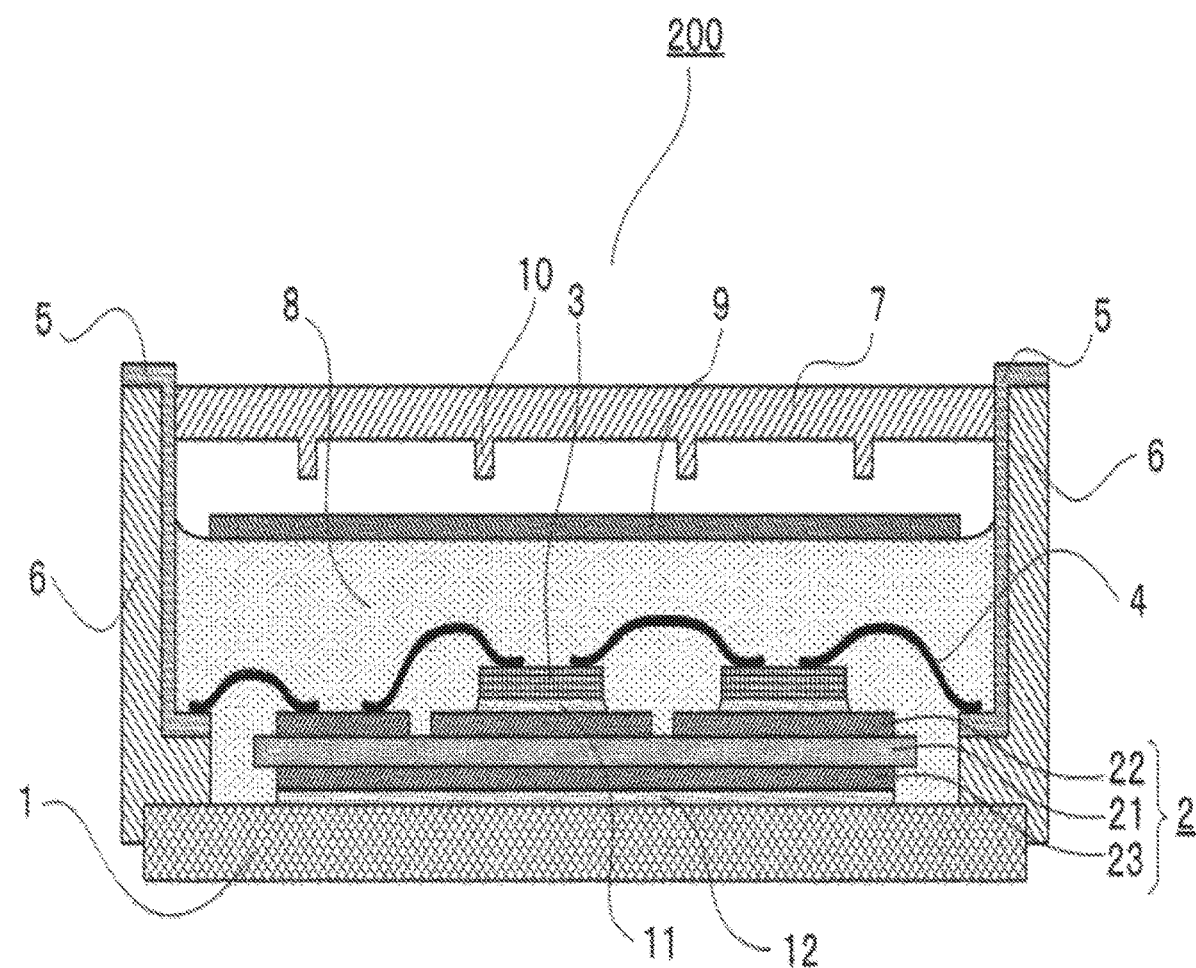
FIG. 4 is a schematic sectional view of the structure of a power module according to Embodiment 2 of the present invention.

FIG. 4 is a schematic sectional view of the structure of a power module according to Embodiment 2 of the present invention. As shown in FIG. 4, a power module 200 includes a base plate 1, an insulating substrate 2, power semiconductor elements 3 each functioning as a semiconductor element, bonding wires 4, terminals 5, a case 6 functioning as a case member, a lid 7 functioning as a lid member, silicone gel 8 which is sealing resin, a pressing plate 9, protrusions 10 which are first protrusions, and solders 11 and 12.

The pressing plate 9 is disposed in close contact with a top face (upper face) of the silicone gel 8. Further, the lid 7 is disposed at a top portion of the case 6. The lid 7 is fixed to the case 6 with adhesive (not illustrated) or screws (not illustrated).

The multiple protrusions 10 are formed on the face of the lid 7 facing the pressing plate 9 so as to protrude toward the pressing plate 9.

The configuration of other components are the same as in Embodiment 1.

Figure 5:
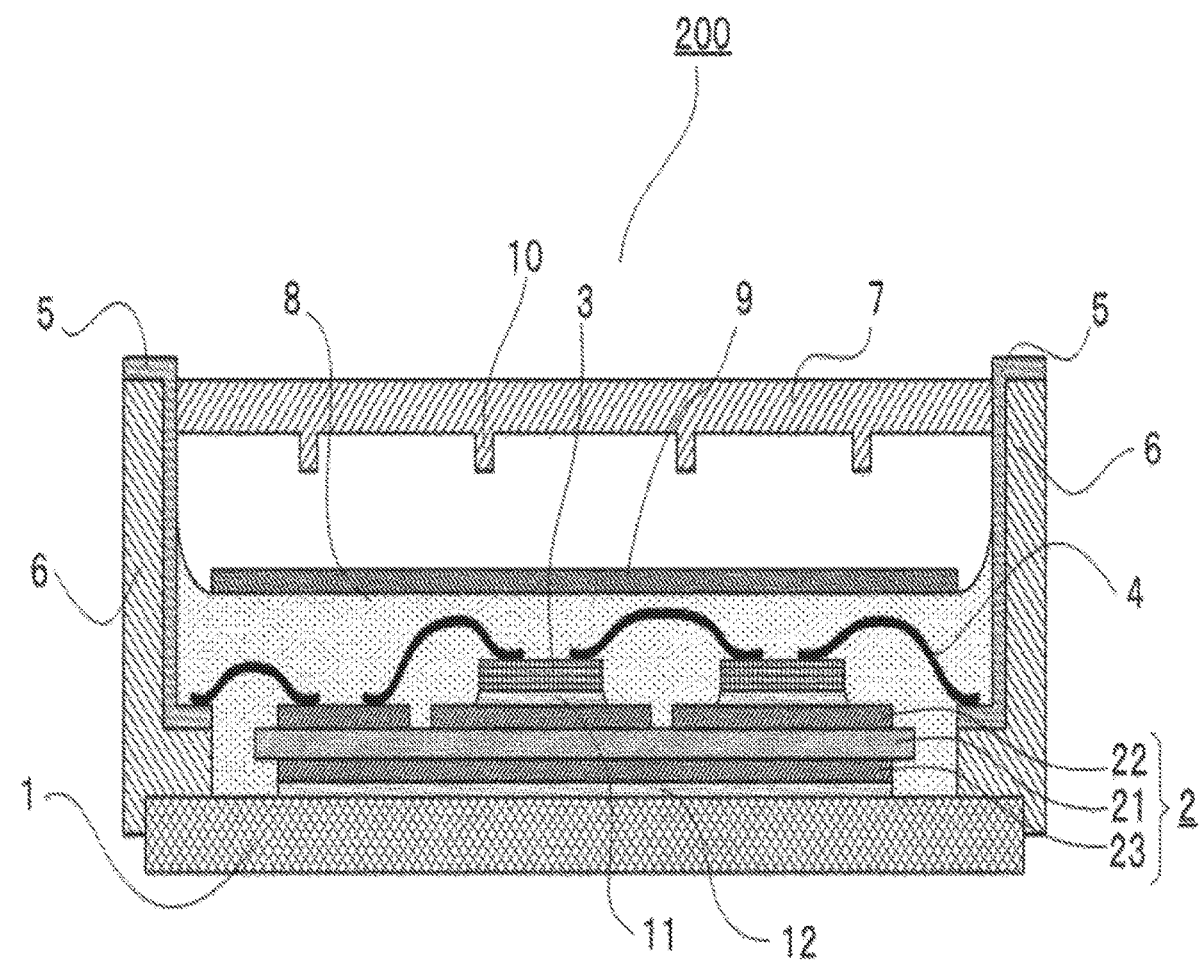
FIG. 5 is a schematic sectional view of the structure of a power module according to Embodiment 2 of the present invention, whose temperature is low.
Figure 6:
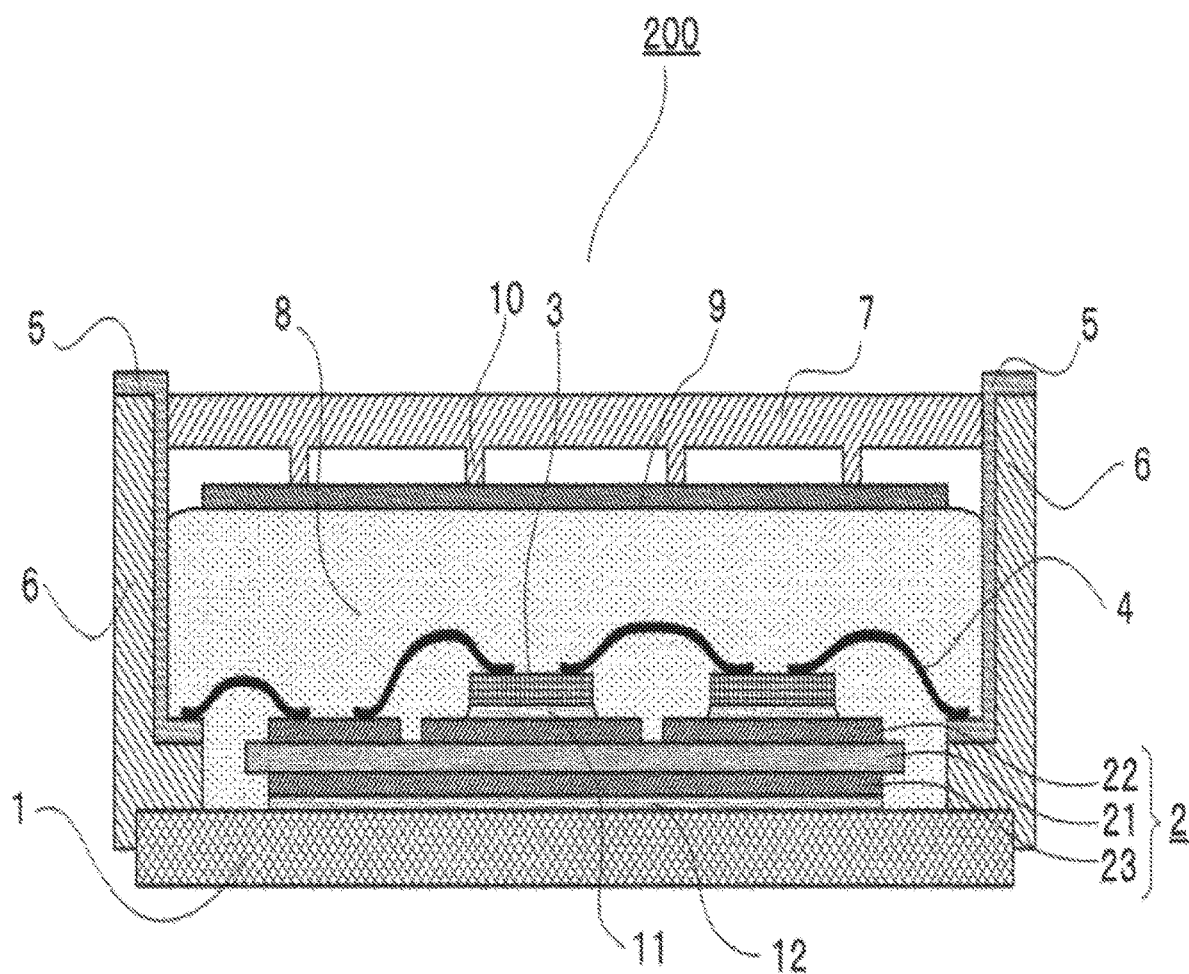
FIG. 6 is a schematic sectional view of the structure of a power module according to Embodiment 2 of the present invention, whose temperature is high.

FIG. 5 is a schematic sectional view of the structure of the power module according to Embodiment 2 of the present invention, whose temperature is low. FIG. 6 is a schematic sectional view of the structure of the power module according to Embodiment 2 of the present invention, whose temperature is high. To be more specific, FIG. 5 is a schematic sectional view of the internal structure of the module 200 whose temperature is lower than the normal temperature. FIG. 6 is a schematic sectional view of the internal structure of the module 200 whose temperature is higher than the curing temperature of the silicone gel 8.

The curing temperature of the silicone gel 8 used for insulation sealing of the power module is normally 60 to 80 degrees C. The linear expansion coefficient of the silicone gel 8 used for insulation sealing of the power module is normally 300 to 400 ppm/K. On the other hand, the linear expansion coefficients of other components used in the power module 200 are 3 to 25 ppm/K, which means that the linear expansion coefficient of the silicone gel 8 is several tens times to one hundred and several tens times larger than those of other components used in the power module 200.

Therefore, when the temperature of the power module 200 decreases to the normal temperature after curing the silicone gel 8 having filled the case 6 to complete the sealing process, the silicone gel 8 shrinks more than other components. At this time, the surface level of the silicone gel 8 becomes lower than that when cured.

As shown in FIG. 5, when the temperature of the power module 200 becomes lower than the normal temperature, the surface level of the silicone gel 8 becomes further lower.

On the other hand, when the temperature of the power module 200 becomes higher than the curing temperature, the silicone gel 8 thermally expands more than other components, so that the surface level of the silicone gel 8 becomes, as shown in FIG. 6, higher than the position when cured.

In the power module 200 described above, when the temperature of the power module 200 becomes lower, the pressing plate 9 is pulled down toward the base plate 1 by the thermal shrinkage of the silicone gel 8. At this time, because of being fixed neither to the case 6 nor to the lid 7, the pressing plate 9 can curve in a convex shape toward the lower side (the side of the base plate 1) according to the thermal shrinkage of the silicone gel 8. As the result, the silicone gel 8 generates almost no thermal stress, preventing the internal stress of the silicone gel 8 from becoming tensile stress. Therefore, even when the temperature of the power module 200 becomes lower, the growth of bubbles and detachments can be suppressed to suppress the detachments of the insulating substrate 2 from the silicone gel 8, consequently suppressing the insulation deterioration of the power module.

When the temperature of the power module 200 becomes higher, the pressing plate 9 is pushed up toward the lid 7 by the thermal expansion of the silicone gel 8. In this situation, when the pressing plate 9 is pushed upward to touch the protrusions 10 formed on the lid 7, because the lid 7 is fixed to the case 6, the pressing plate 9 cannot move any further in the direction toward the lid 7, so that the position of the pressing plate 9 gets fixed there. In this state, the silicone gel 8 becomes unable to thermally expand any more, and the internal stress of the silicone gel 8 becomes compressive stress. Because the internal stress of the silicone gel 8 becomes compressive stress, even when the temperature of the power module 200 becomes higher, the growth of bubbles and detachments can be suppressed to suppress the detachments of the insulating substrate 2 from the silicone gel 8, consequently suppressing the insulation deterioration of the power module.

Figure 7:
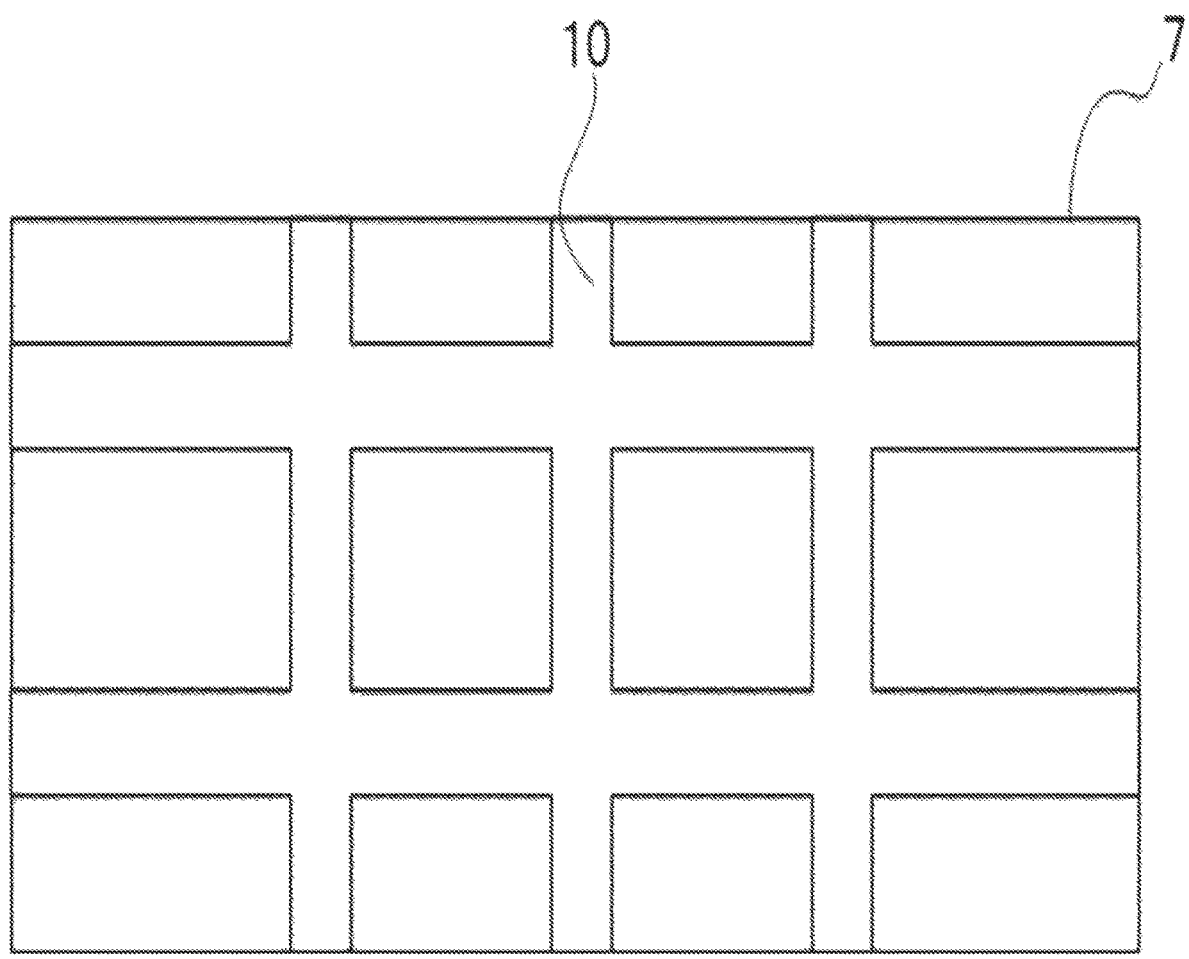
FIG. 7 is a schematic plan view of the structure of a lid of the power module according to Embodiment 2 of the present invention.
Figure 8:
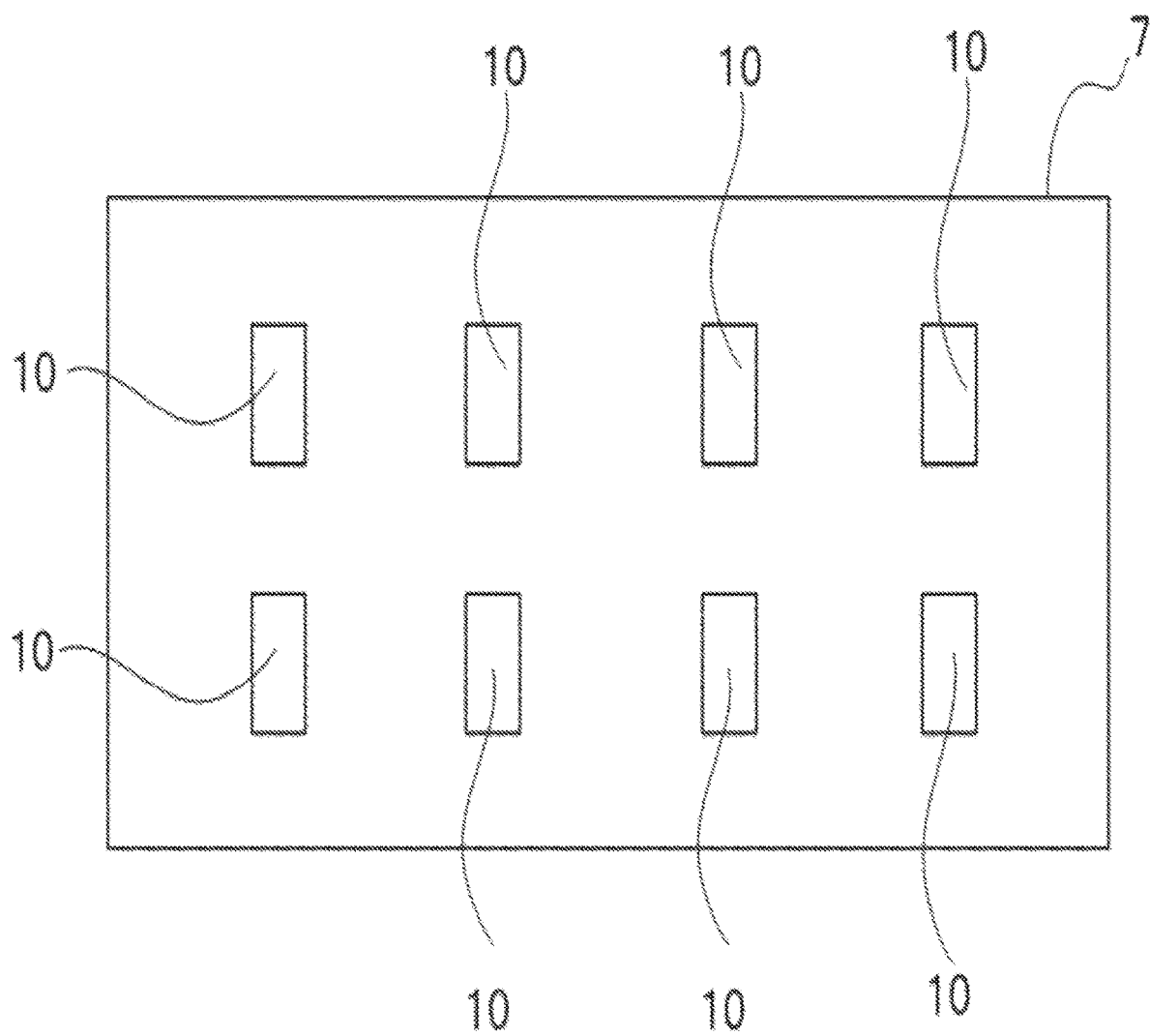
FIG. 8 is a schematic plan view of the structure of another lid of the power module according to Embodiment 2 of the present invention.
Figure 9:
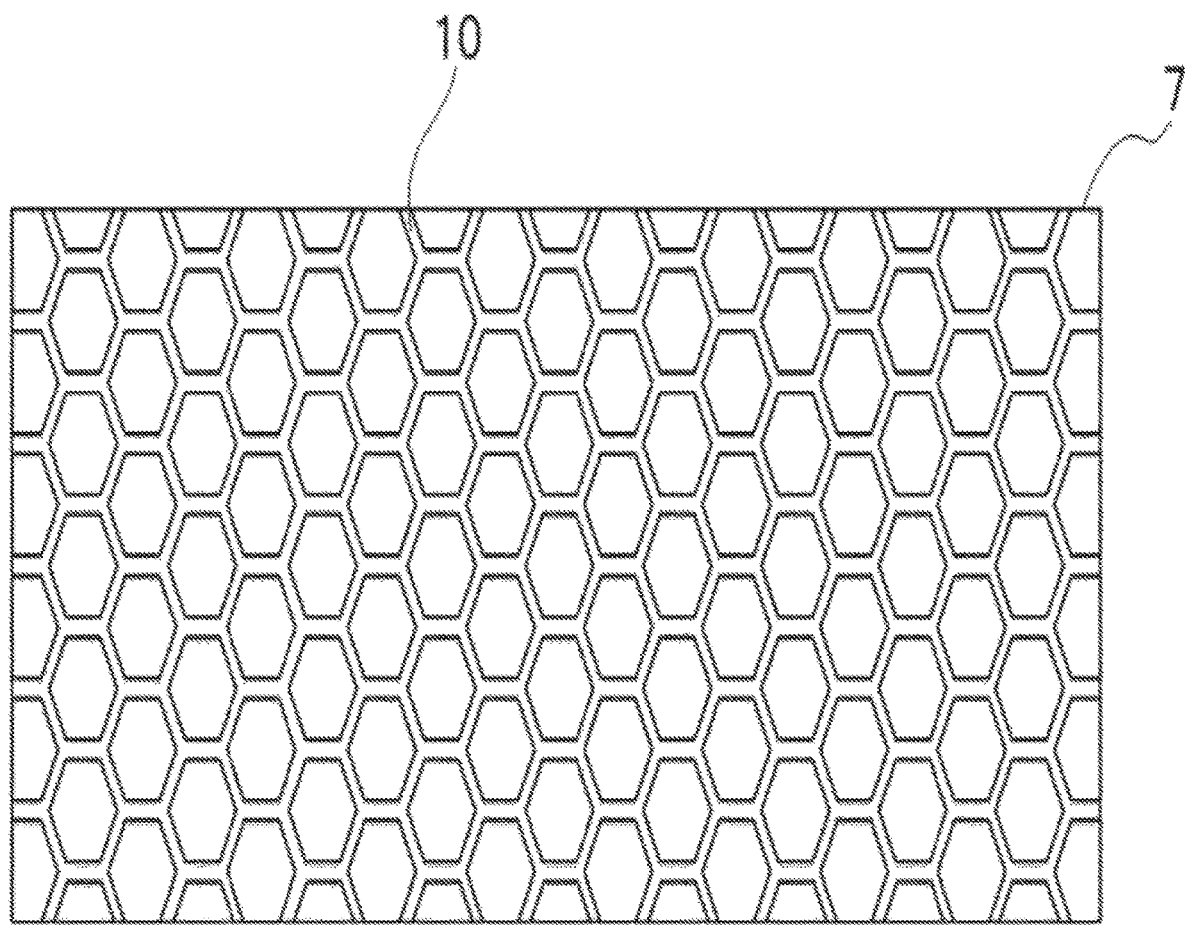
FIG. 9 is a schematic plan view of the structure of another lid of the power module according to Embodiment 2 of the present invention.
Figure 10:
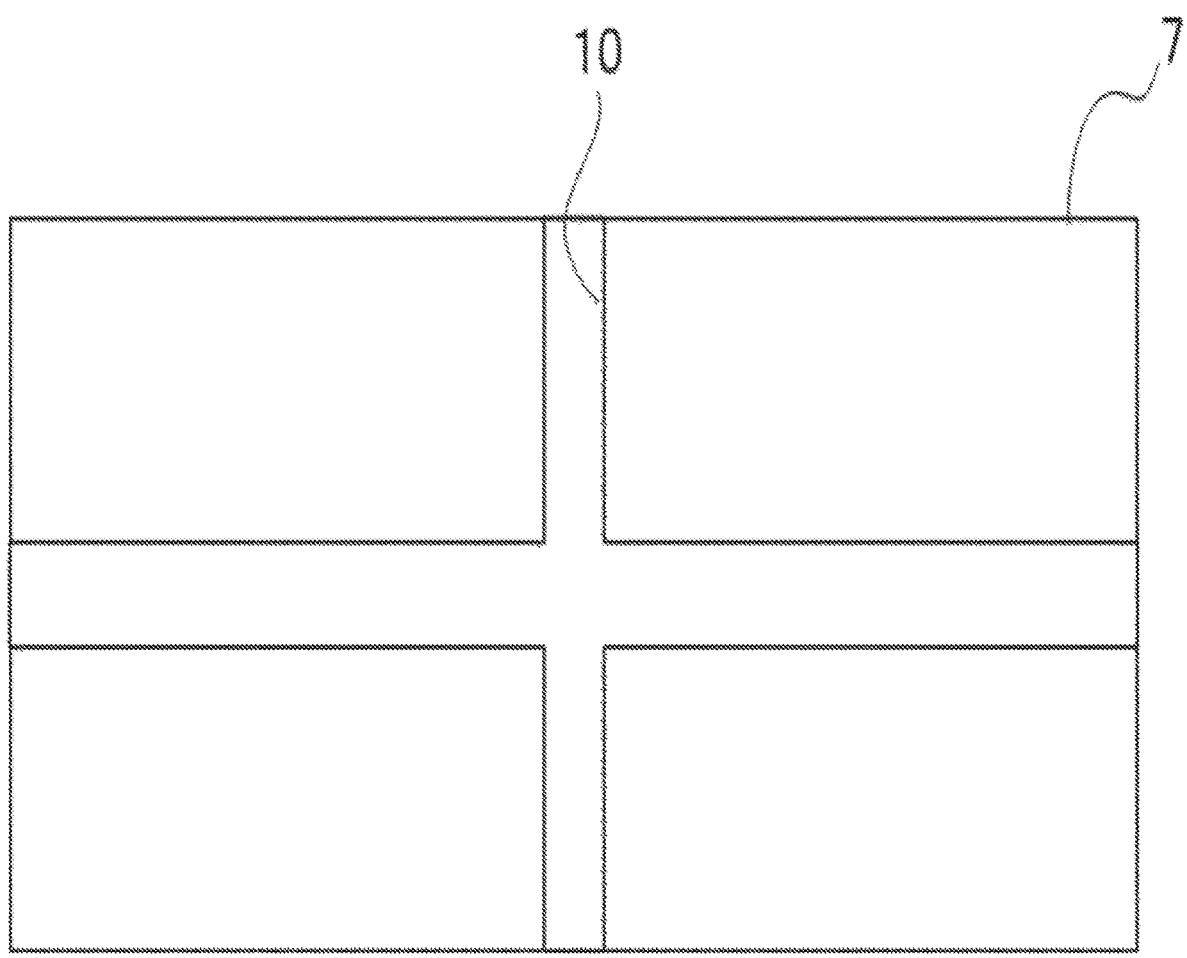
FIG. 10 is a schematic plan view of the structure of another lid of the power module according to Embodiment 2 of the present invention.
Figure 11:
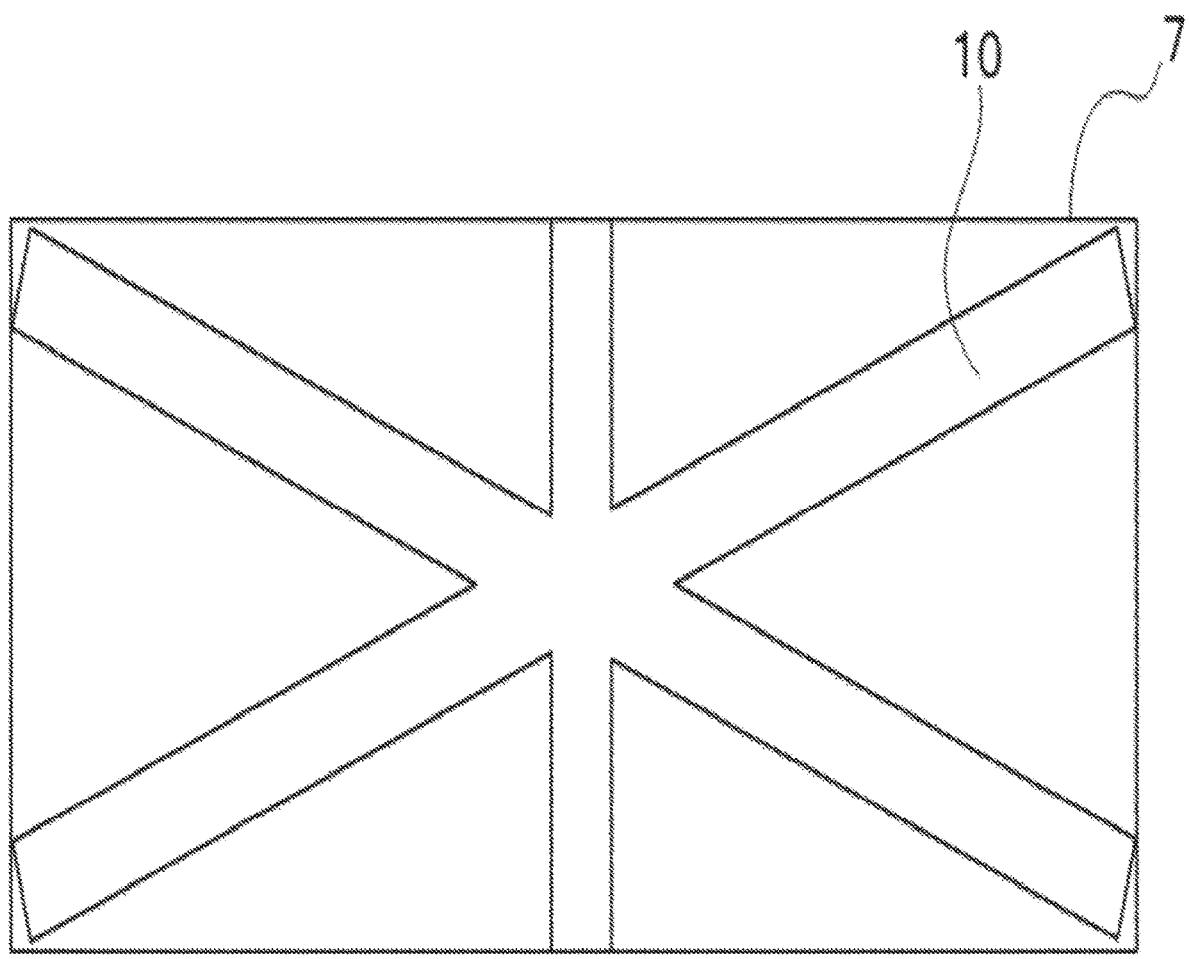
FIG. 11 is a schematic plan view of the structure of another lid of the power module according to Embodiment 2 of the present invention.
Figure 12:
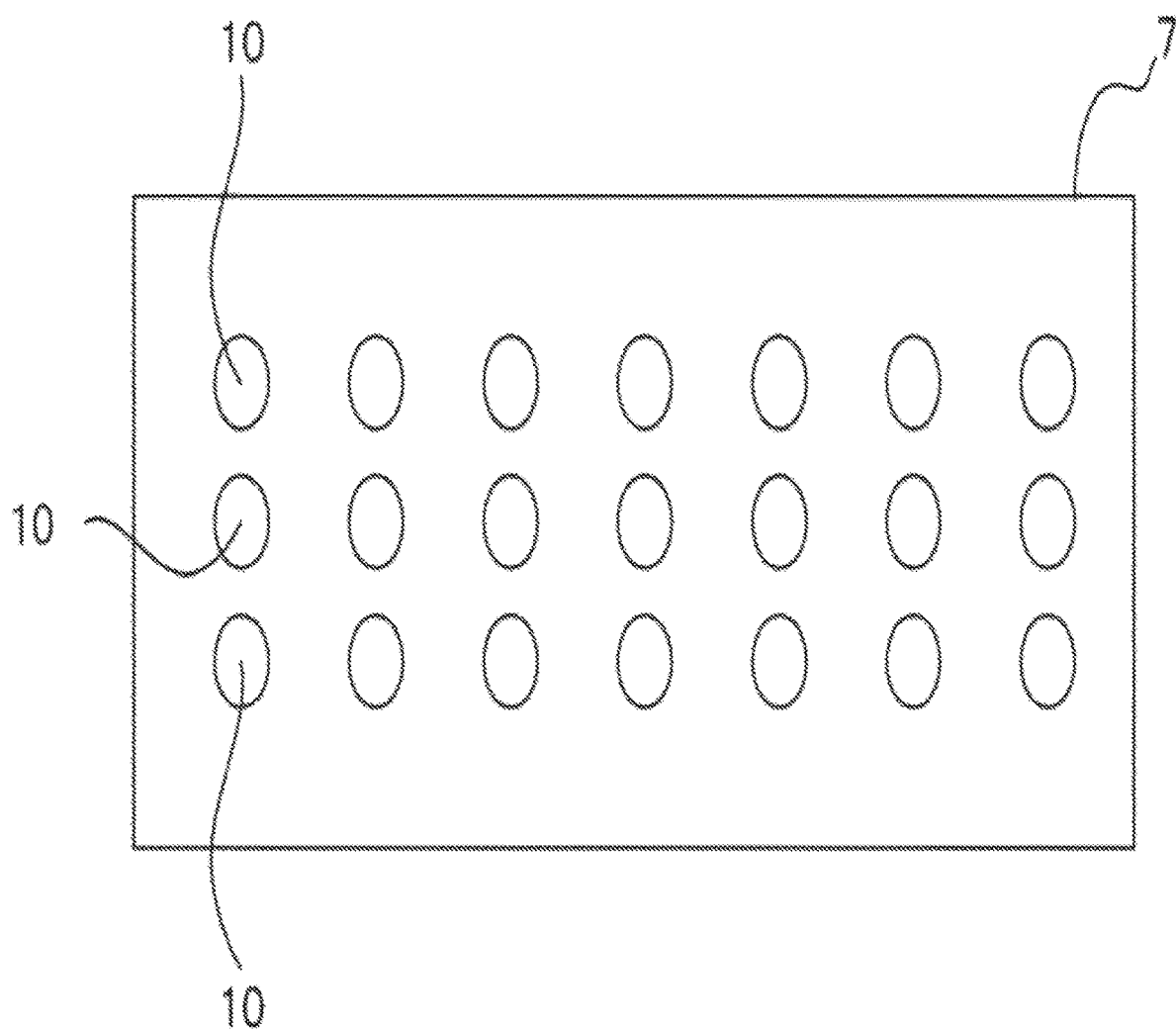
FIG. 12 is a schematic plan view of the structure of another lid of the power module according to Embodiment 2 of the present invention.
Figure 13:
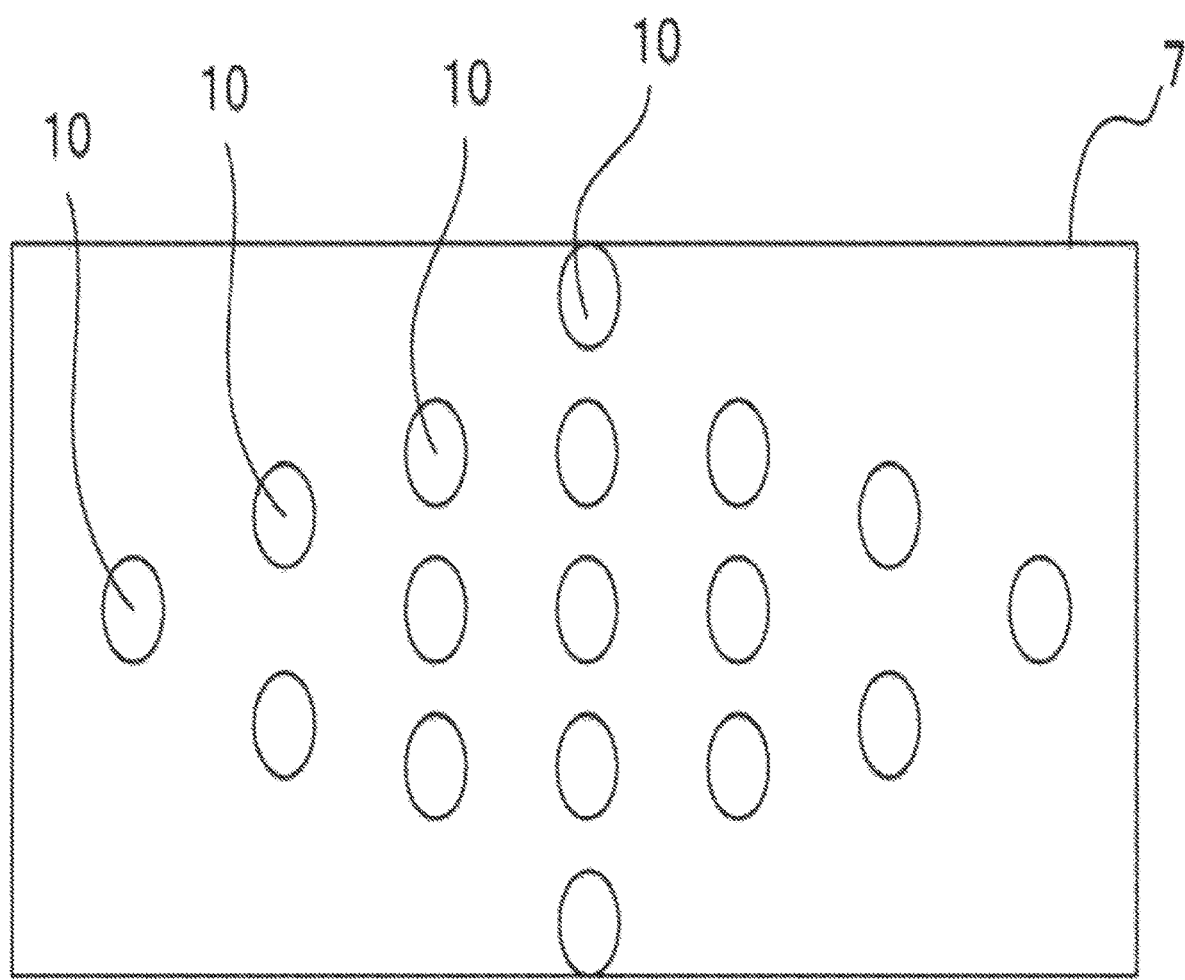
FIG. 13 is a schematic plan view of the structure of another lid of the power module according to Embodiment 2 of the present invention.

FIG. 7 is a schematic plan view of the structure of the lid of the power module according to Embodiment 2 of the present invention. In FIG. 7, a protrusion 10 is provided on the face of the lid 7 facing the pressing plate 9 in the module 200. FIG. 8 is a schematic plan view of the structure of another lid of the power module according to Embodiment 2 of the present invention. FIG. 9 is a schematic plan view of the structure of another lid of the power module according to Embodiment 2 of the present invention. FIG. 10 is a schematic plan view of the structure of another lid of the power module according to Embodiment 2 of the present invention. FIG. 11 is a schematic plan view of the structure of another lid of the power module according to Embodiment 2 of the present invention. FIG. 12 is a schematic plan view of the structure of another lid of the power module according to Embodiment 2 of the present invention. FIG. 13 is a schematic plan view of the structure of another lid of the power module according to Embodiment 2 of the present invention. As shown in FIGS. 7 to 13, the protrusion(s) 10 is provided on the face of the lid 7 facing the pressing plate 9 in the module 200. In FIGS. 7 to 13, the shapes of the protrusions 10 provided on the lid 7 are different. The protrusions 10 shown in FIG. 7, FIG. 10 and FIG. 11 are formed in a lattice shape. The protrusion 10 shown in FIG. 7 is formed in a combination of multiple stripes. The protrusion 10 shown in FIG. 10 is formed in a cross shape.

The protrusion 10 shown in FIG. 11 is formed in a shape spreading radially from the center of the lid 7. The protrusions 10 shown in FIG. 8, FIG. 12 and FIG. 13 are formed in a dot pattern. Each of the protrusions 10 shown in FIG. 8 is a rectangular. Each of the protrusions 10 shown in FIG. 12 and FIG. 13 is a circle. The protrusion 10 in FIG. 9 has a honeycomb structure with hexagons.

In the sectional structure of the power module 200 shown in FIG. 4, the multiple protrusions 10 are provided. The number of the protrusions 10, however, may be one if a single protrusion 10 can prevent the pressing plate 9 from ascending. A pressing plate 9 having a large plane area and a thin thickness tends to have low rigidity, so that the pressing plate 9 can easily be warped when it is pressed to the protrusion 10. The warped pressing plate 9 has a less pressing effect, and consequently the silicone gel 8 has less compressive stress. In such a case, formation of multiple protrusions 10 with narrower arrangement intervals between them as shown in FIGS. 7 to 13, can suppress the warpage of the pressing plate 9 when it is pressed to the protrusions 10. The number of the protrusions 10 and the arrangement intervals are properly determined so that the warpage of the pressing plate 9 does not cause a problem.

Even when filling level of the silicone gel 8 varies, the protrusions 10 provided on the lid 7 come into contact with the pressing plate 9, so that the silicone gel 8 can be pressed uniformly. By providing the protrusions 10 on the lid 7, the rigidity of the lid 7 is improved, thereby suppressing the warpage of the lid 7.

The protrusions 10 may take any shape, providing that when it is pressed to the protrusions 10, the pressing plate 9 neither moves nor warps.

The protrusions 10 may be formed integrally with the lid 7, or the protrusions 10 may be formed as separate components, to be arranged at positions on the lid 7 which do not cause any warpage problem of the pressing plate 9.

In the power module 200 configured as described above, the pressing plate is disposed between the sealing resin and the lid so as to be in close contact with the sealing resin, which thereby makes it possible to suppress the growth of bubbles and detachments caused by stress changes due to the sealing resin's expansion and shrinkage according to temperature changes of the power module 200. As the result, detachment between the sealing resin and the insulating substrate can be suppressed, which leads to improvement of the insulation reliability of the power module.

Even when the filling level of the silicone gel 8 in the case 6 is not even, the provision of the protrusions 10 on the lid 7 can suppress partial contact of the pressing plate 9 to generate uniform compressive stress against the silicone gel 8.

Further, the provision of the protrusions 10 in ridge shapes on the lid 7 can suppress deflection of the lid 7 to improve its rigidity.

Embodiment 3

Embodiment 3 is different from Embodiment 2 in that the protrusions 10, which are formed on the lid 7 in Embodiment 2, are formed on the face of the pressing plate 9 facing the lid 7. Even in the case where the protrusions 13 are formed on the face of the pressing plate 9 facing the lid 7, it is also possible to suppress the growth of bubbles and detachments caused by stress changes due to the sealing resin's expansion and shrinkage. As the result, detachment between the sealing resin and the insulating substrate can be suppressed, which leads to improvement of the insulation reliability of the power module.

Figure 14:
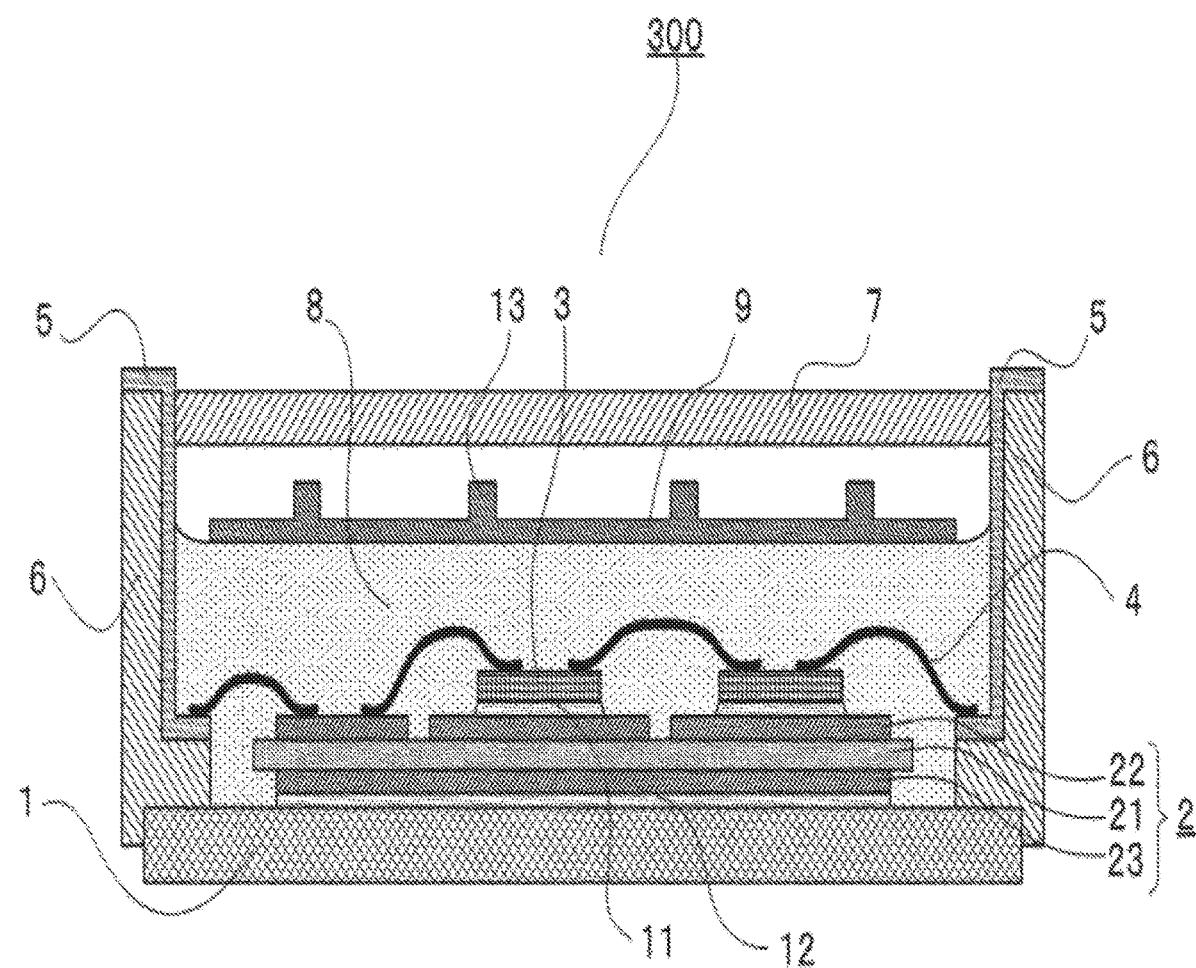
FIG. 14 is a schematic sectional view of the structure of a power module according to Embodiment 3 of the present invention.

FIG. 14 is a schematic sectional view of the structure of a power module according to Embodiment 3 of the present invention. As shown in FIG. 14, a power module 300 includes a base plate 1, an insulating substrate 2, power semiconductor elements 3 each functioning as a semiconductor element, bonding wires 4, terminals 5, a case 6 functioning as a case member, a lid 7 functioning as a lid member, silicone gel 8 which is sealing resin, a pressing plate 9, protrusions 13 which are second protrusions, and solders 11 and 12.

The pressing plate 9 is disposed in close contact with a top face (upper face) of the silicone gel 8. Further, the lid 7 is disposed at a top portion of the case 6. The lid 7 is fixed to the case 6 with adhesive (not illustrated) or screws (not illustrated).

The multiple protrusions 13 are formed on the upper side of the pressing plate 9 so as to protrude toward the lid 7.

The configuration of other components are the same as in Embodiment 1.

In the power module 300 described above, when the temperature of the power module 300 becomes lower, the pressing plate 9 is pulled down toward the base plate 1 by the thermal shrinkage of the silicone gel 8. At this time, because of being fixed neither to the case 6 nor to the lid 7, the pressing plate 9 can curve in a convex shape toward the lower side (the side of the base plate 1) according to the thermal shrinkage of the silicone gel 8. As the result, the silicone gel 8 generates almost no thermal stress, preventing the internal stress of the silicone gel 8 from becoming tensile stress. Therefore, even when the temperature of the power module 300 becomes lower, the growth of bubbles and detachments can be suppressed to suppress the detachments of the insulating substrate 2 from the silicone gel 8, and consequently suppressing the insulation deterioration of the power module.

When the temperature of the power module 300 becomes higher, the pressing plate 9 is pushed up toward the lid 7 by the thermal expansion of the silicone gel 8. In this situation, when the pressing plate 9 is pushed upward until the protrusions 13 formed on the pressing plate 9 touch the lid 7, because the lid 7 is fixed to the case 6, the pressing plate 9 cannot move any further in the direction toward the lid 7, so that the position of the pressing plate 9 gets fixed there. At this state, the silicone gel 8 becomes unable to thermally expand any more, and the internal stress of the silicone gel 8 becomes compressive stress. Because the internal stress of the silicone gel 8 becomes compressive stress, even when the temperature of the power module 300 becomes higher, the growth of bubbles and detachments can be suppressed to suppress the detachments of the insulating substrate 2 from the silicone gel 8, consequently suppressing the insulation deterioration of the power module.

Figure 15:
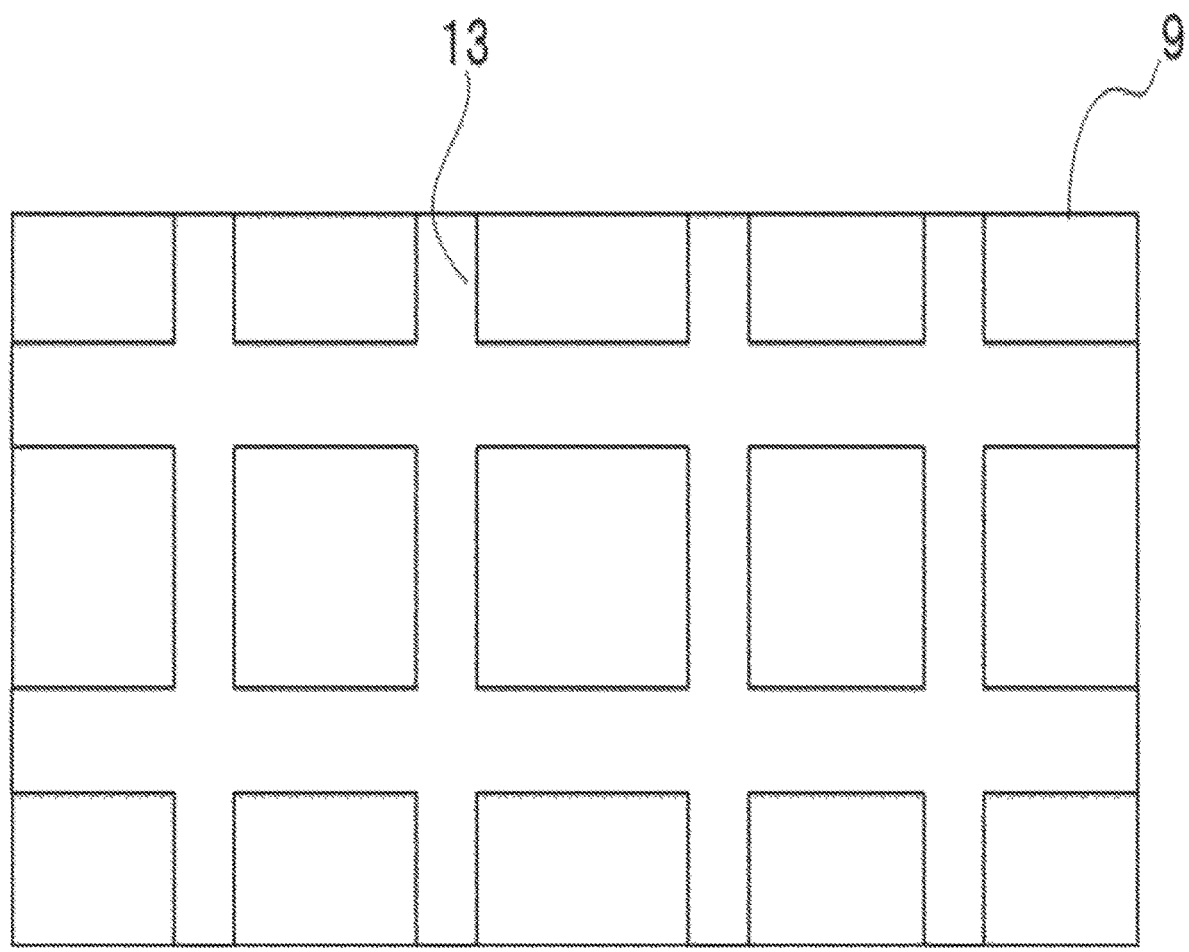
FIG. 15 is a schematic plan view of the structure of a pressing plate of the power module according to Embodiment 3 of the present invention.
Figure 16:
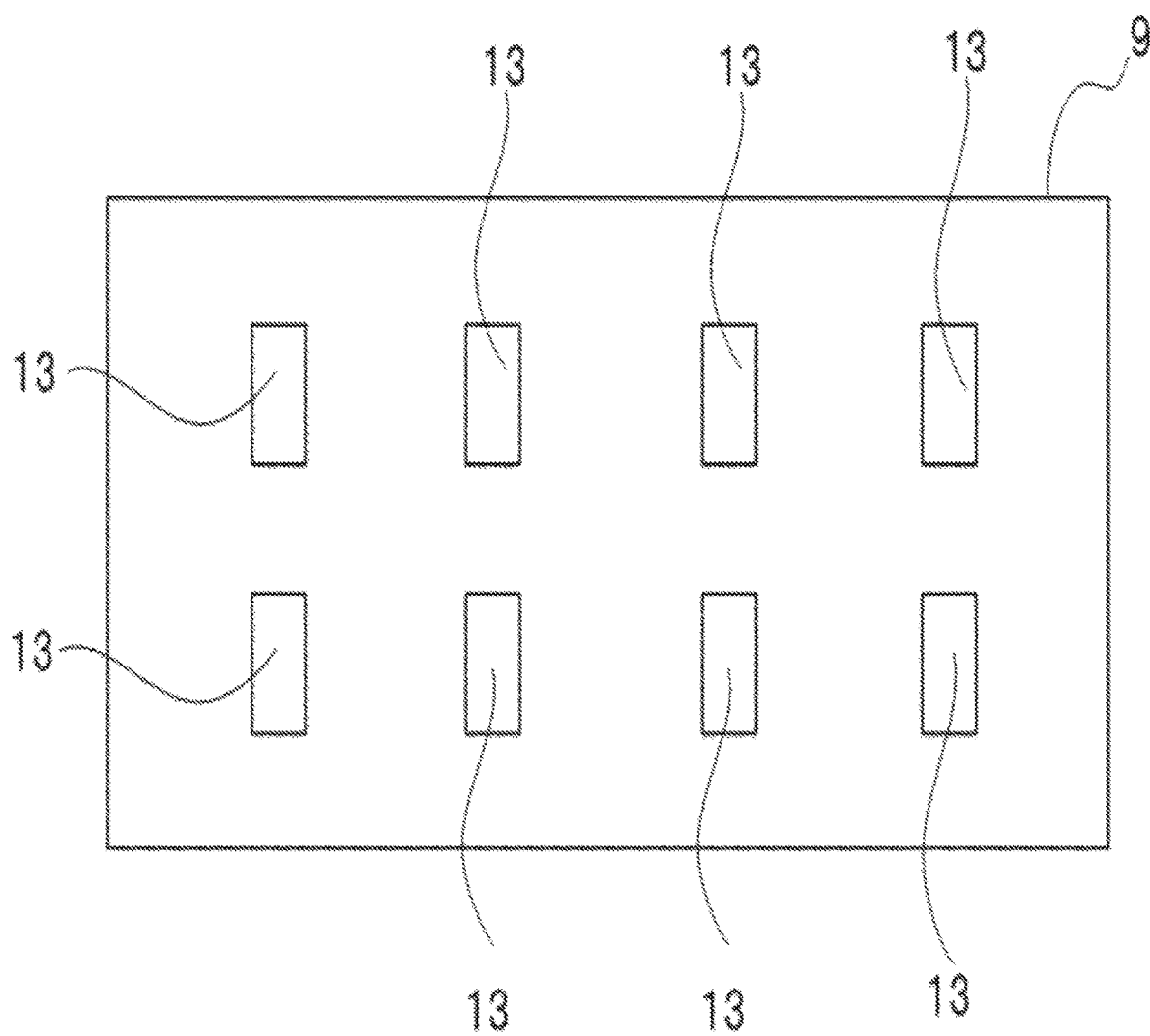
FIG. 16 is a schematic plan view of the structure of another pressing plate of the power module according to Embodiment 3 of the present invention.

FIG. 15 is a schematic plan view of the structure of a pressing plate of the power module according to Embodiment 3 of the present invention. FIG. 16 is a schematic plan view of the structure of another pressing plate of the power module according to Embodiment 3 of the present invention. The shapes of the protrusions 13 disposed on the pressing plates 9 are different between FIG. 15 and FIG. 16.

In Embodiment 3, multiple protrusions 13 are provided. The number of the protrusions 13, however, may be one if a single protrusion 13 can prevent the pressing plate 9 from ascending. The number of the protrusions 13 and the arrangement intervals are properly determined so that the warpage of the pressing plate 9 does not cause a problem.

The protrusions 13 may take any shape, providing that when the protrusions 13 are pressed to the lid 7, the pressing plate 9 neither moves nor warps. Even when the protrusions 13 are formed into the same shapes as used for the protrusions 10 of the lid 7 shown in Embodiment 2, the same effect can be achieved in comparison with the protrusions 13 shown in FIG. 15 and FIG. 16.

By increasing the number of the protrusions 13 and enlarging the area given thereto the rigidity of the pressing plate 9 can be increased to suppress the warpage of the pressing plate 9. Therefore, even if the temperature of the power module 300 becomes higher, the growth of bubbles and detachments can be suppressed to suppress the insulation deterioration of the power module.

The protrusions 13 may be formed integrally with the pressing plate 9, or the protrusions 13 may be formed as separate components, to be arranged at positions which do not cause any warpage problem of the pressing plate 9.

In the power module 300 configured as described above, the pressing plate is disposed between the sealing resin and the lid so as to be in close contact with the sealing resin, which thereby makes it possible to suppress the growth of bubbles and detachments caused by stress changes due to the sealing resin's expansion and shrinkage according to temperature changes of the power module 300. As the result, detachment between the sealing resin and the insulating substrate can be suppressed, which leads to improvement of the insulation reliability of the power module.

Even when the filling level of the silicone gel 8 in the case 6 is not even, the provision of the protrusions 13 on the pressing plate 9 can suppress partial contact of the pressing plate 9 to the lid 7 to generate uniform compressive stress against the silicone gel 8.

Further, the provision of the protrusions 13 in ridge shapes on the pressing plate 9 can suppress deflection of the pressing plate 9 to improve rigidity.

Embodiment 4

Embodiment 4 is different from Embodiment 2 or 3 in that protrusions, which are formed either on the lid 7 or on the pressing plate 9 in Embodiments 2 and 3, are formed both on the lid 7 and on the pressing plate 9 at the positions facing each other. Even in the case where the protrusion 13 are formed on the face of the pressing plate 9, facing the lid 7, it is also possible to suppress the growth of bubbles and detachments caused by stress changes due to the sealing resin's expansion and shrinkage. As the result, detachment between the sealing resin and the insulating substrate can be suppressed, which leads to improvement of the insulation reliability of the power module.

Figure 17:
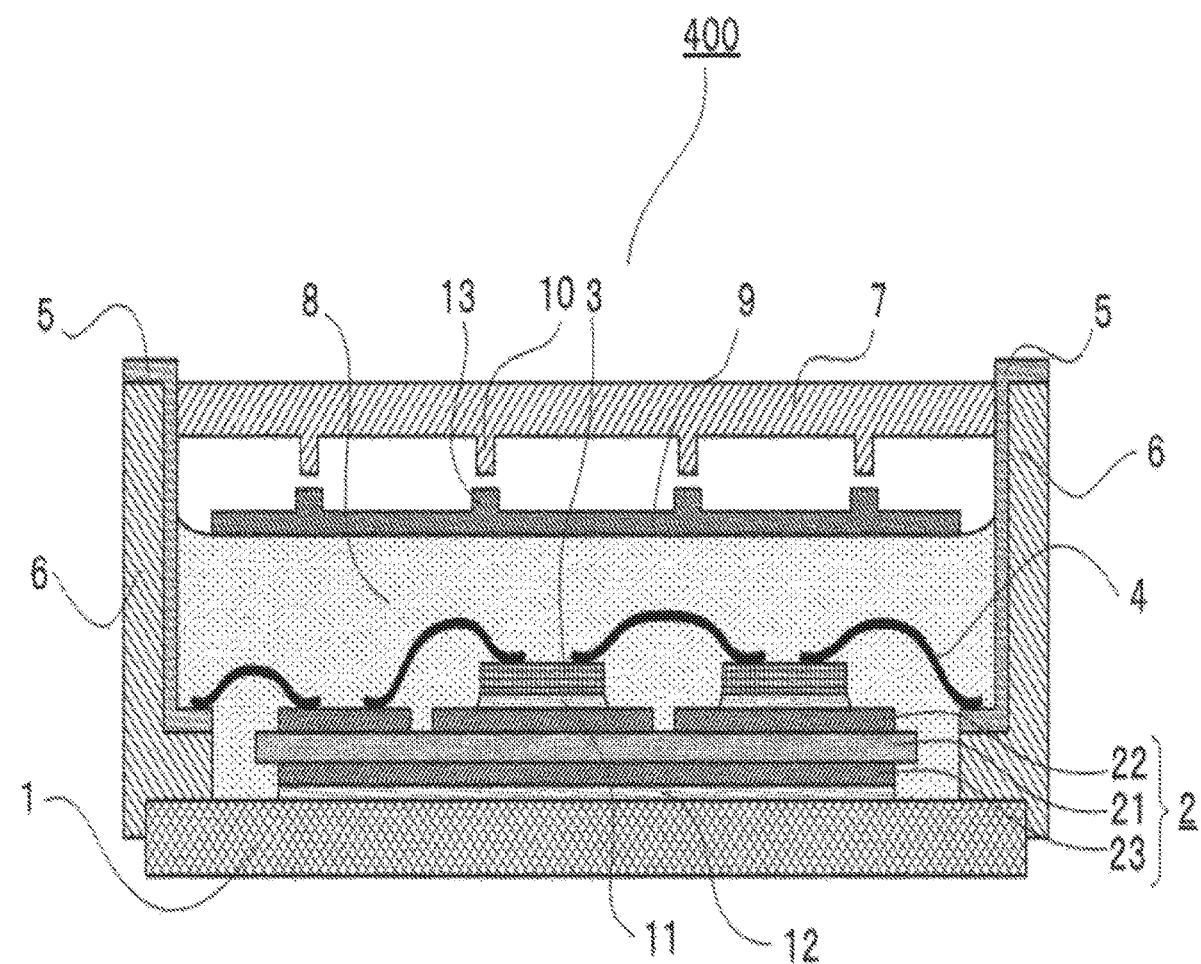
FIG. 17 is a schematic sectional view of the structure of a power module according to Embodiment 4 of the present invention.

FIG. 17 is a schematic sectional view of the structure of a power module according to Embodiment 4 of the present invention. As shown in FIG. 17, a power module 400 includes a base plate 1, an insulating substrate 2, power semiconductor elements 3 each functioning as a semiconductor element, bonding wires 4, terminals 5, a case 6 functioning as a case member, a lid 7 functioning as a lid member, silicone gel 8 which is sealing resin, a pressing plate 9, protrusions 10 which are first protrusions, solders 11 and 12, and protrusions 13 which are second protrusions.

Figure 18:
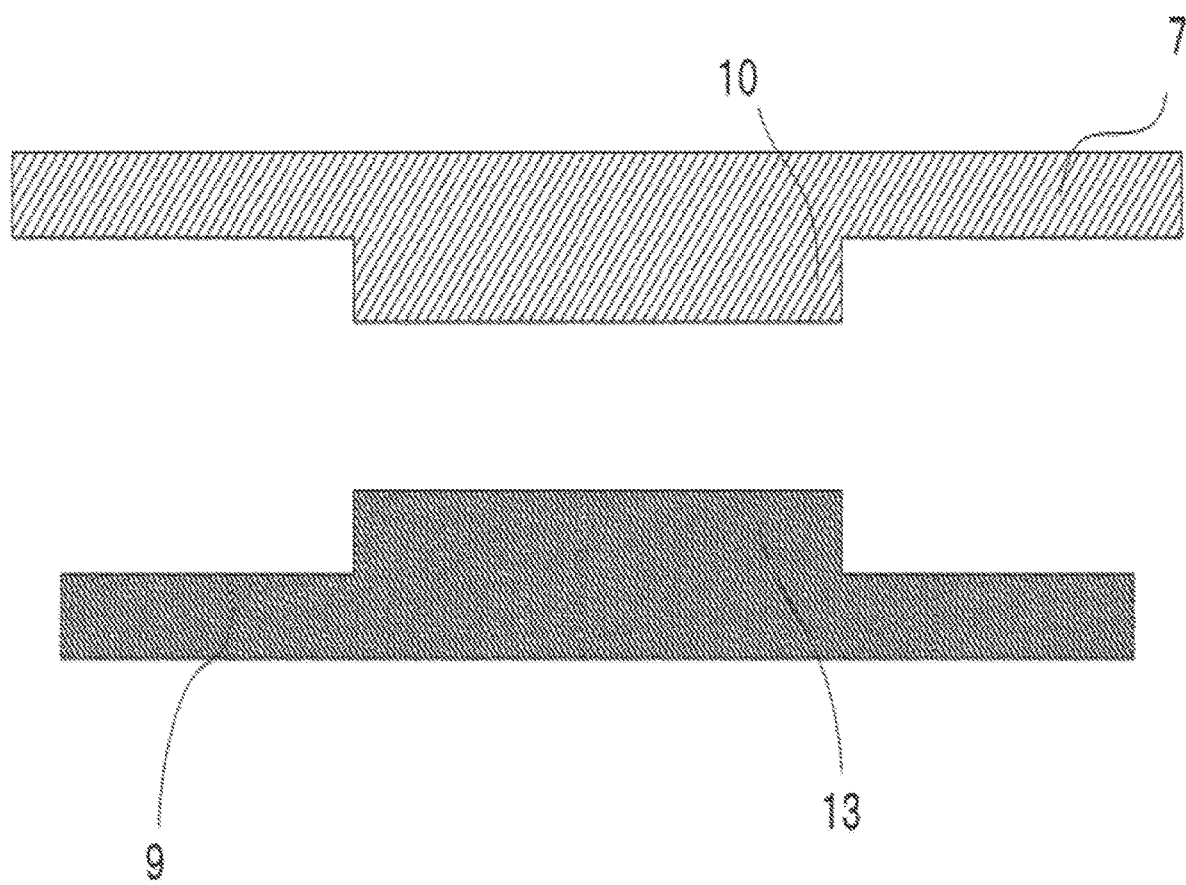
FIG. 18 is a schematic sectional view of the structure of another lid and another pressing plate of the power module according to Embodiment 4 of the present invention.
Figure 19:
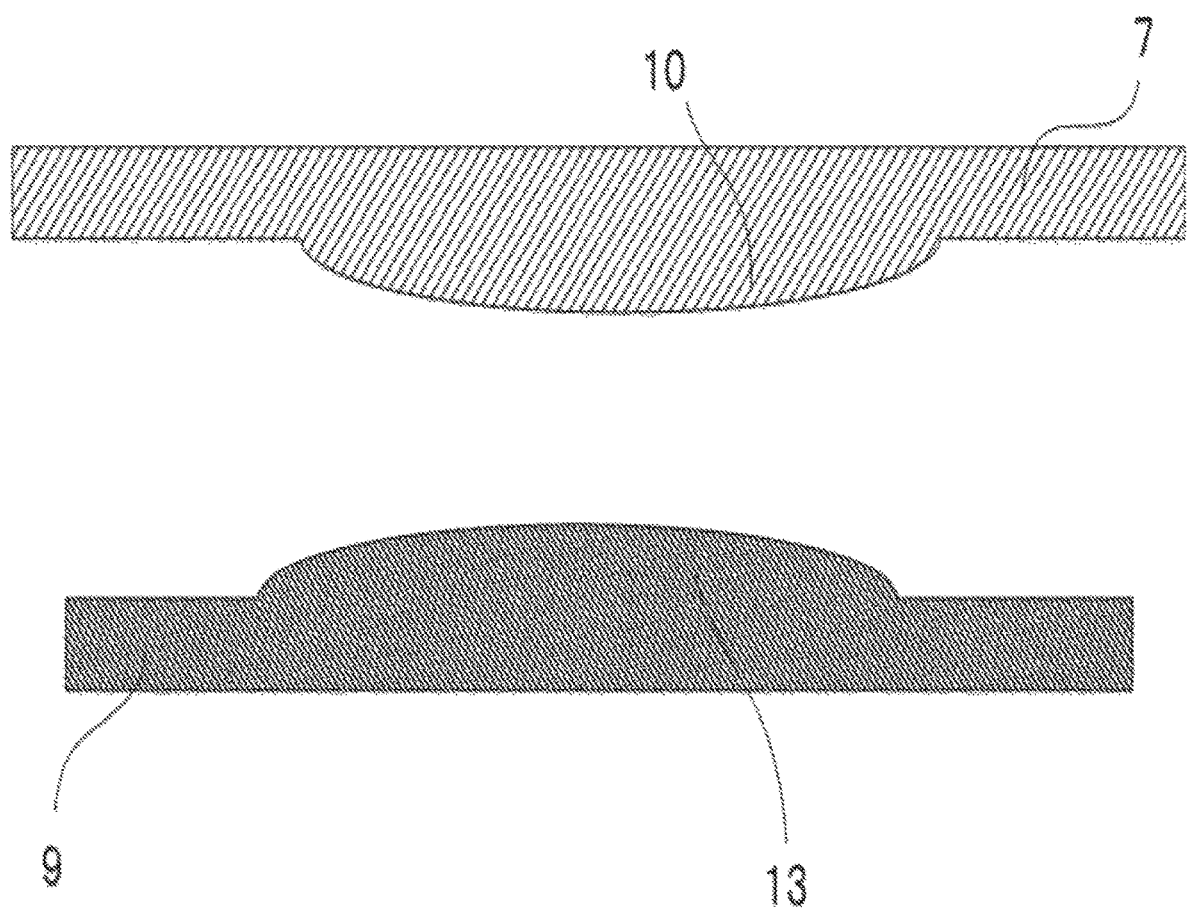
FIG. 19 is a schematic sectional view of the structure of another lid and another pressing plate of the power module according to Embodiment 4 of the present invention.
Figure 20:
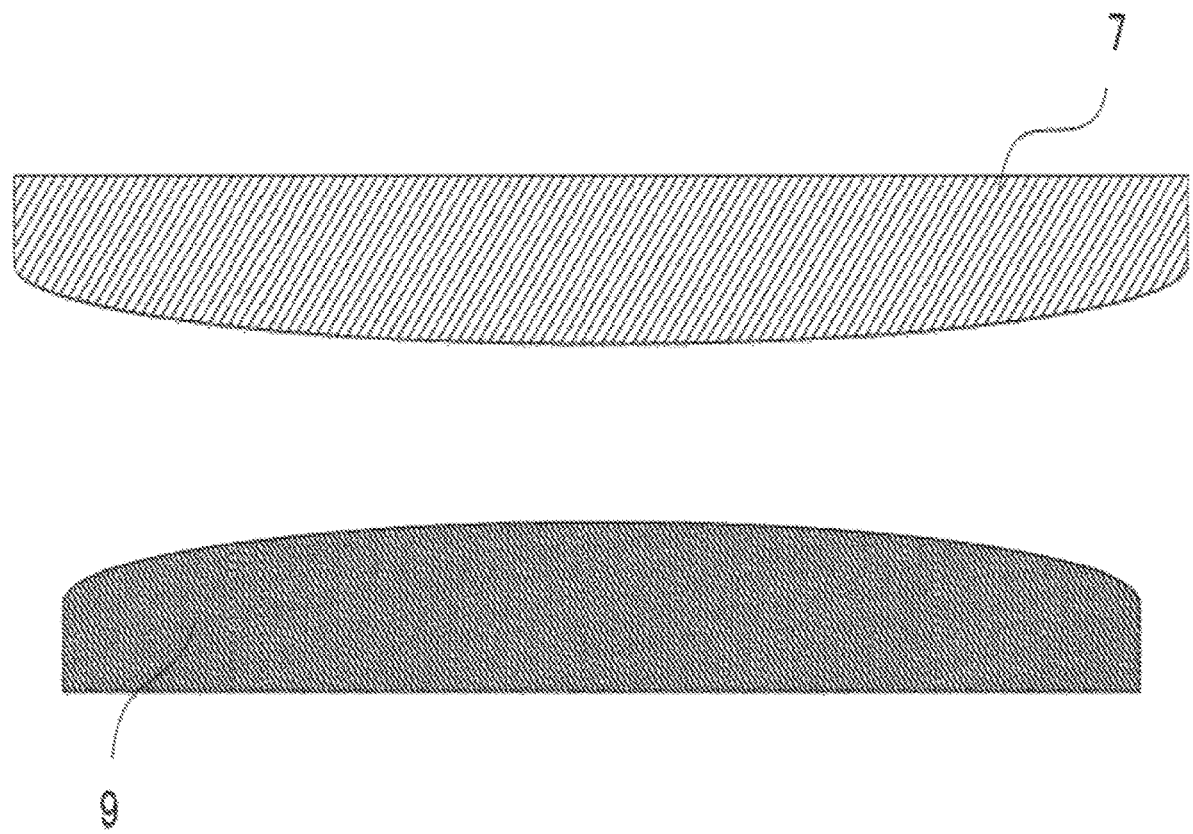
FIG. 20 is a schematic sectional view of the structure of another lid and another pressing plate of the power module according to Embodiment 4 of the present invention.

FIG. 18 is a schematic sectional view of the structure of another lid and another pressing plate of the power module according to Embodiment 4 of the present invention. As shown in FIG. 18, a protrusion 10 is provided on the face of the lid 7 facing the pressing plate 9 in the module 400. Also, a protrusion 13 is provided on the face of the pressing plate 9 facing the lid 7. FIG. 19 is a schematic sectional view of the structure of another lid and another pressing plate of the power module according to Embodiment 4 of the present invention. FIG. 20 is a schematic sectional view of the structure of another lid and another pressing plate of the power module according to Embodiment 4 of the present invention. The shapes of the protrusions 10 and 13 provided on the lids 7 and the pressing plates 9 are different among FIGS. 18 to 20. Any combination of the lids 7 and the pressing plates 9 in FIGS. 18, 19 and 20 is possible as long as the protrusions 10 and the protrusions 13 are disposed at the positions that make the protrusions 13 face the respective protrusions 10.

The pressing plate 9 is disposed in close contact with a top face (upper face) of the silicone gel 8. Further, the lid 7 is disposed at a top portion of the case 6. The lid 7 is fixed to the case with adhesive (not illustrated) or screws (not illustrated).

The multiple protrusions 13 are formed on the upper side of the pressing plate 9 so as to protrude toward the lid 7. Further, the multiple protrusions 10 are formed on the lower side of the lid 7 at the positions that make them face the respective multiple protrusions 13 formed on the pressing plate 9.

The configuration of other components are the same as in Embodiment 1.

In the power module 400 described above, when the temperature of the power module 400 becomes lower, the pressing plate 9 is pulled down toward the base plate 1 by the thermal shrinkage of the silicone gel 8. At this time, because of being fixed neither to the case 6 nor to the lid 7, the pressing plate 9 can curve in a convex shape toward the lower side (the side of the base plate 1) according to the thermal shrinkage of the silicone gel 8. As the result, the silicone gel 8 generates almost no thermal stress, preventing the internal stress of the silicone gel 8 from becoming tensile stress. Therefore, even when the temperature of the power module 400 becomes lower, the growth of bubbles and detachments can be suppressed to suppress the detachments of the insulating substrate 2 from the silicone gel 8, consequently suppressing the insulation deterioration of the power module.

When the temperature of the power module 400 becomes higher, the pressing plate 9 is pushed up toward the lid 7 by the thermal expansion of the silicone gel 8. In this situation, when the pressing plate 9 is pushed upward until the pressing plate 9 touches the protrusions 10 formed on the lid 7, because the lid 7 is fixed to the case 6, the pressing plate 9 cannot move any further in the direction toward the lid 7, so that the position of the pressing plate 9 gets fixed there. At this state, the silicone gel 8 becomes unable to thermally expand any more, and the internal stress of the silicone gel 8 becomes compressive stress. Because the internal stress of the silicone gel 8 becomes compressive stress, even when the temperature of the power module 400 becomes higher, the growth of bubbles and detachments can be suppressed to suppress the detachments of the insulating substrate 2 from the silicone gel 8, consequently suppressing the insulation deterioration of the power module.

In Embodiment 4, multiple protrusions 10 and 13 are provided. The respective numbers of the protrusions 10 and 13, however, may be one if a set of a single protrusion 13 and a single protrusion 10 can prevent the pressing plate 9 from ascending. The numbers of the protrusions 10 and 13, and the arrangement intervals are properly determined so that the warpage of the pressing plate 9 does not cause a problem. The protrusions 10 and 13 may take any shape, providing that when the protrusions 10 are pressed to the protrusions 13, the pressing plate 9 neither moves nor warps.

If the seizes of the protrusions 10 and the protrusions 13 are different from each other, this can deal with a case where a positional deviation between the protrusions 10 and the protrusions 13 is produced when the pressing plate 9 ascends toward the lid 7 due to the thermal expansion of the silicone gel 8.

By increasing the number of the protrusions 13 and enlarging the area given thereto, the rigidity of the pressing plate 9 can be increased to suppress the warpage of the pressing plate 9. Therefore, even if the temperature of the power module 400 becomes higher, the growth of bubbles and detachments can be suppressed, to suppress the insulation deterioration of the power module.

The protrusions 10 may be formed integrally with the lid 7, or the protrusions 10 may be formed as separate components, to be arranged at positions which does not cause any warpage problem of the pressing plate 9.

Also, the protrusions 10 may be formed integrally with the pressing plate 9, or the protrusions 13 may be formed as separate components, to be arranged at positions which do not cause any warpage problem of the pressing plate 9.

In the power module 400 configured as described above, the pressing plate is disposed between the sealing resin and the lid so as to be in close contact with the sealing resin, which thereby makes it possible to suppress the growth of bubbles and detachments caused by stress changes due to the sealing resin's expansion and shrinkage according to temperature changes of the power module 400. As the result, detachment between the sealing resin and the insulating substrate can be suppressed, which leads to improvement of the insulation reliability of the power module.

Even when the filling level of the silicone gel 8 in the case 6 is not even, the provision of the protrusions 10 on the lid 7 and the provision of the protrusions 13 on the pressing plate 9 can suppress partial contact of the pressing plate 9 to the lid 7 to generate uniform compressive stress against the silicone gel 8.

Further, the provision of the protrusions 10 in ridge shapes on the lid 7 can suppress deflection of the lid 7 to improve its rigidity. Also, the provision of the protrusions 13 in ridge shapes on the pressing plate 9 can suppress deflection of the pressing plate 9 to improve its rigidity.

Embodiment 5

Embodiment 5 is different from Embodiment 2 in that multiple pressing plates 9 are disposed on the silicone gel 8, whereas a single pressing plate 9 is disposed thereon in Embodiment 2. Even in the case where the multiple pressing plates 9 are provided and the protrusions 10 are formed on the face of the lid 7 facing the pressing plates 9, it is also possible to suppress the growth of bubbles and detachments caused by stress changes due to the sealing resin's expansion and shrinkage. As the result, detachment between the sealing resin and the insulating substrate can be suppressed, which leads to improvement of the insulation reliability of the power module.

Figure 21:
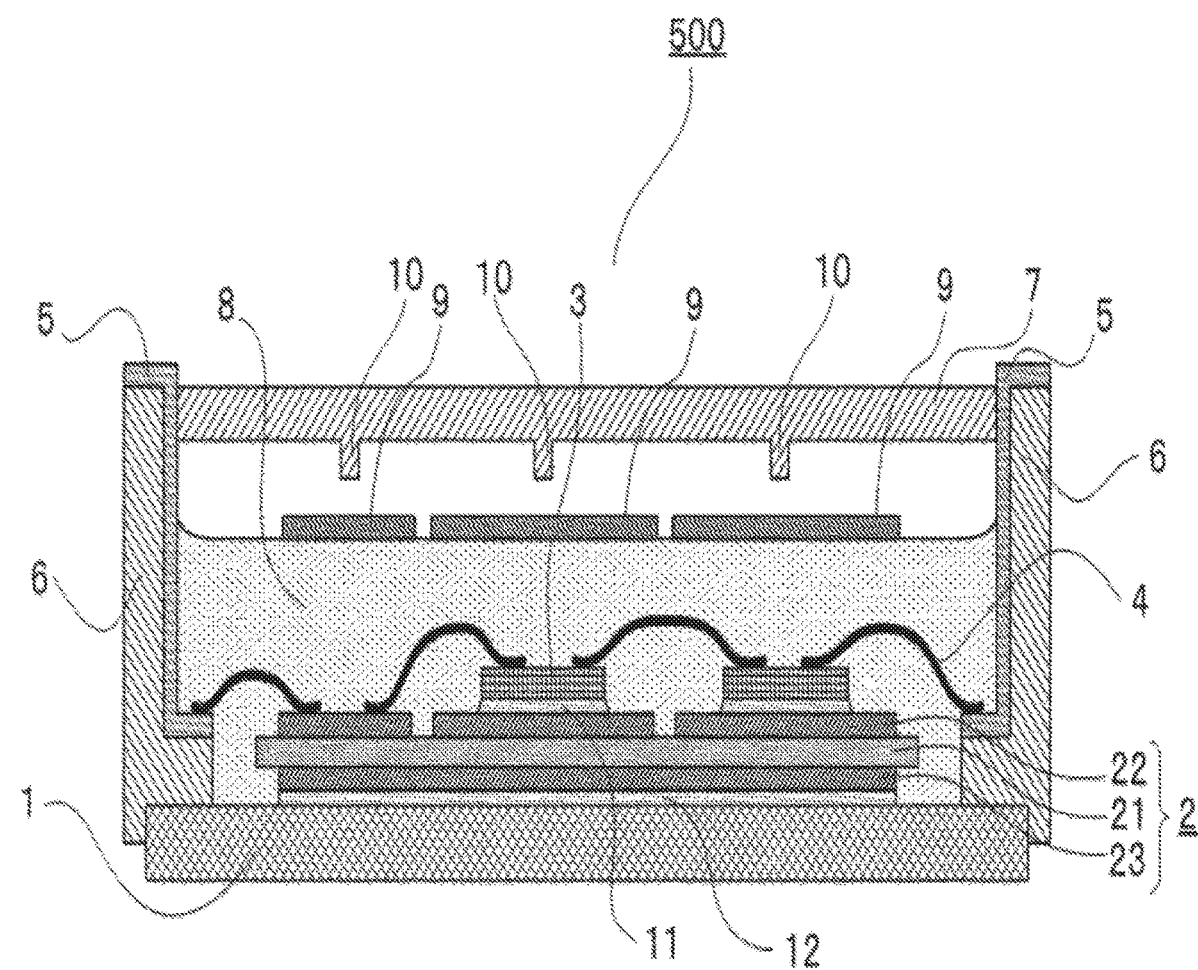
FIG. 21 is a schematic sectional view of the structure of a power module according to Embodiment 5 of the present invention.

FIG. 21 is a schematic sectional view of the structure of a power module according to Embodiment 5 of the present invention. As shown in FIG. 21, a power module 500 includes a base plate 1, an insulating substrate 2, power semiconductor elements 3 each functioning as a semiconductor element, bonding wires 4, terminals 5, a case 6 functioning as a case member, a lid 7 functioning as a lid member, silicone gel 8 which is sealing resin, pressing plates 9, protrusions 10 which are first protrusions, and solders 11 and 12.

The multiple pressing plates 9 are disposed in close contact with a top face (upper face) of the silicone gel 8. The pressing plates 9 of multiple division pieces are arranged so as to correspond, via the silicone gel 8, to wiring patterns formed on a metal plate 22 on the insulating substrate 2. The lid 7 is disposed at a top portion of the case 6. The lid 7 is fixed to the case with adhesive (not illustrated) or screws (not illustrated). The protrusions 10 are formed on the lid 7 at the positions corresponding to the respective multiple pressing plates 9.

The configuration of other components are the same as in Embodiment 1.

In the power module 500 described above, when the temperature of the power module 500 becomes lower, the pressing plates 9 are pulled down toward the base plate 1 by the thermal shrinkage of the silicone gel 8. At this time, because of being fixed neither to the case 6 nor to the lid 7, the pressing plates 9 can curve in a convex shape toward the lower side (the side of the base plate 1) according to the thermal shrinkage of the silicone gel 8. As the result, the silicone gel 8 generates almost no thermal stress, preventing the internal stress of the silicone gel 8 from becoming tensile stress. Therefore, even when the temperature of the power module 500 becomes lower, the growth of bubbles and detachments can be suppressed to suppress the detachments of the insulating substrate 2 from the silicone gel 8, consequently suppressing the insulation deterioration of the power module.

When the temperature of the power module 500 becomes higher, the pressing plate 9 is pushed up toward the lid 7 by the thermal expansion of the silicone gel 8. In this situation, when the pressing plates 9 are pushed upward to touch the protrusions 10 formed on the lid 7, because the lid 7 is fixed to the case 6, the pressing plates 9 cannot move any further in the direction toward the lid 7, so that the positions of the pressing plates 9 get fixed there. At this state, the silicone gel 8 becomes unable to thermally expand any more, and the internal stress of the silicone gel 8 becomes compressive stress. Because the internal stress of the silicone, gel 8 becomes compressive stress, even when the temperature of the power module 500 becomes higher, the growth of bubbles and detachments can be suppressed to suppress the detachments of the insulating substrate 2 from the silicone gel 8, consequently suppressing the insulation deterioration of the power module.

Figure 22:
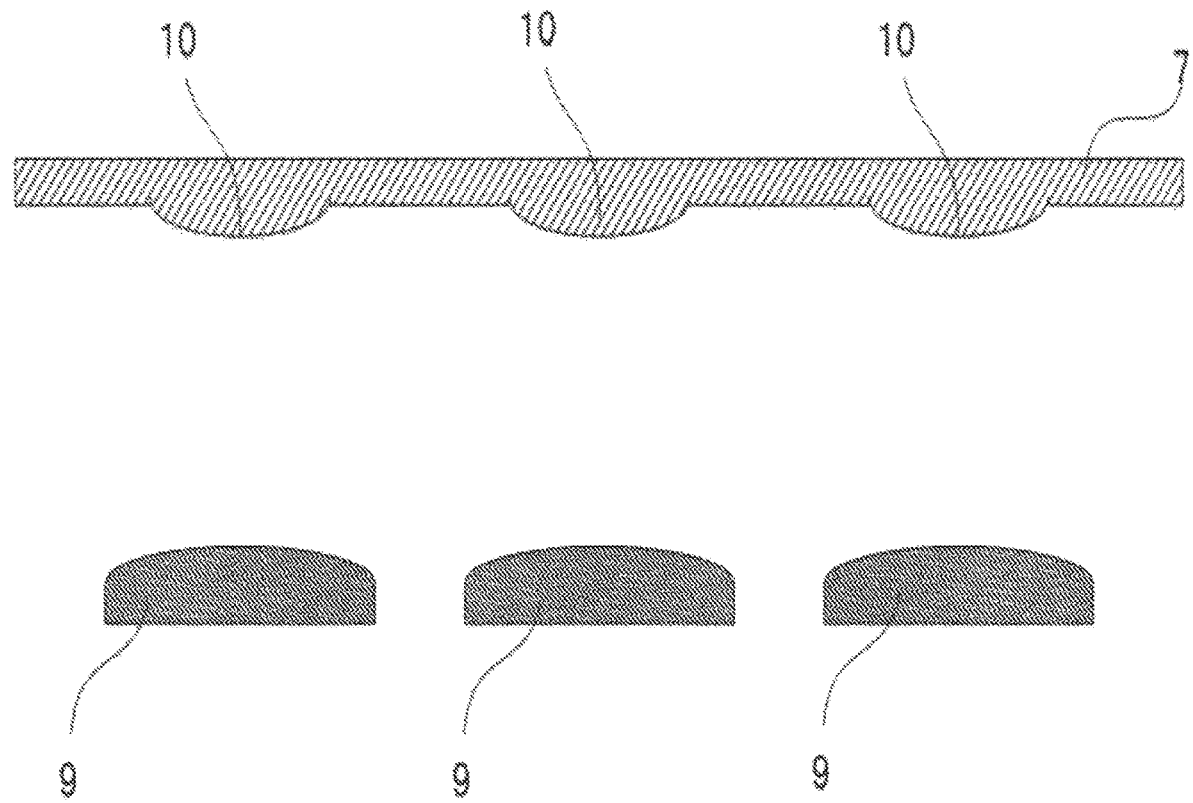
FIG. 22 is a schematic sectional view of the structure of another lid and pressing plates of the power module according to Embodiment 5 of the present invention.

FIG. 22 is a schematic sectional view of the structure of another lid and another pressing plate of the power module according to Embodiment 5 of the present invention. As shown in FIG. 22, the lid 7 has the protrusions 10 on the face facing the multiple pressing plates 9 disposed in the module 500, at the positions corresponding to the respective pressing plates 9.

In the power module 500 configured as described above, the pressing plates are disposed between the sealing resin and the lid so as to be in close contact with the sealing resin, which thereby makes it possible to suppress the growth of bubbles and detachments caused by stress changes due to the sealing resin's expansion and shrinkage according to temperature changes of the power module 500. As the result, detachment between the sealing resin and the insulating substrate can be suppressed, which leads to improvement of the insulation reliability of the power module.

Even when the filling level of the silicone gel 8 in the case 6 is not even, the provision of the protrusions 10 on the lid 7 can suppress partial contact of the pressing plates 9 to generate uniform compressive stress against the silicone gel 8.

Further, the provision of the protrusions 10 in ridge shapes on the lid 7 can suppress defection of the lid 7 to improve its rigidity.

The compressive stress produced in the silicone gel 8 can be controlled by dividing a pressing plate 9 into multiple pieces to arrange them at spots where bubbles and detachments have to be suppressed.

Embodiment 6

Embodiment 6 is different from Embodiment 2 in that springs 14 are provided as substitutes for the protrusions 10 formed on the lid 7 in Embodiment 2. The springs 14 provided as substitutes for the protrusions 10 can suppress the growth of bubbles and detachments caused by stress changes due to the sealing resin's expansion and shrinkage. As the result, detachment between the sealing and the insulating substrate can be suppressed, which leads to improvement of the insulation reliability of the power module.

Figure 23:
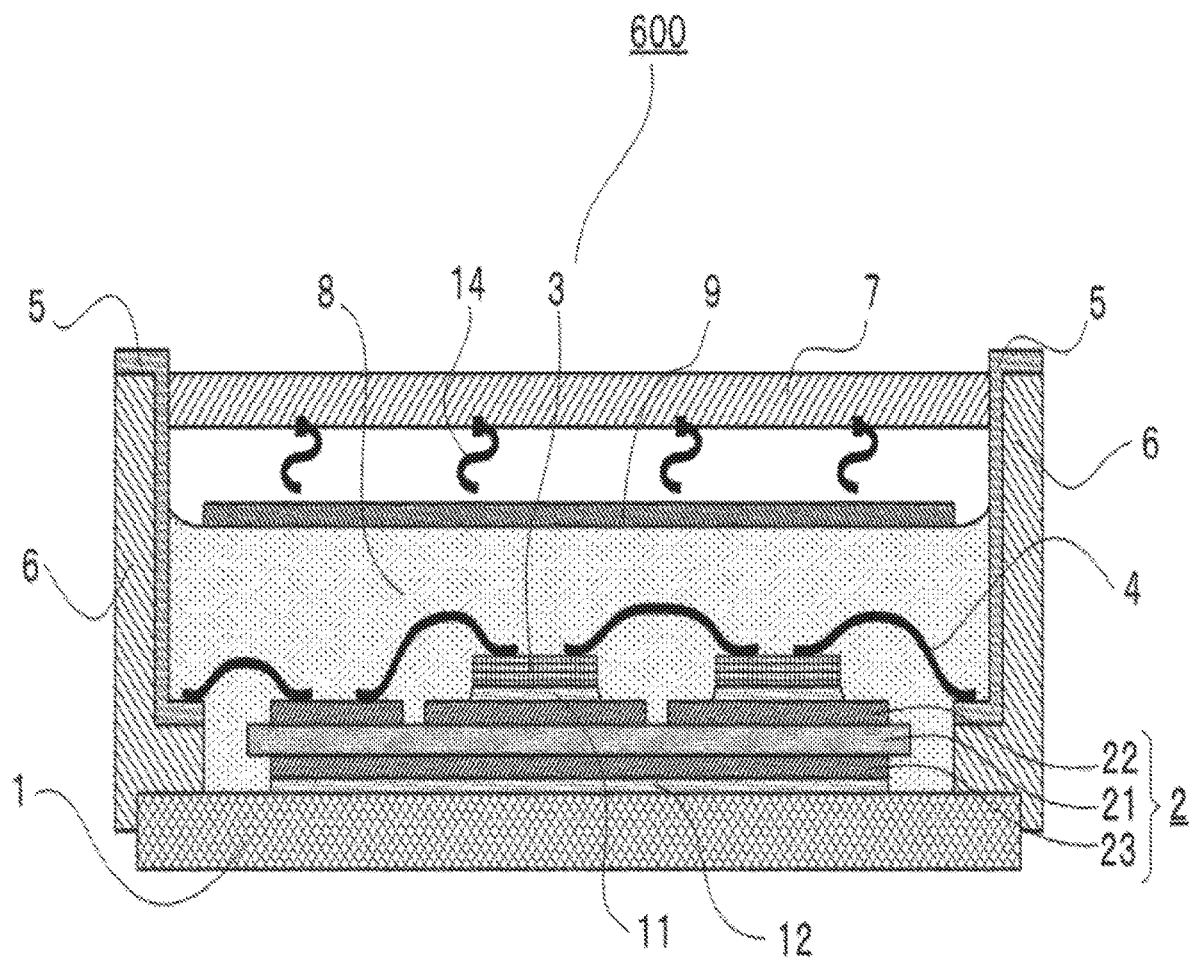
FIG. 23 is a schematic sectional view of the structure of a power module according to Embodiment 6 of the present invention.

FIG. 23 is a schematic sectional view of the structure of a power module according to Embodiment 6 of the present invention. As shown in FIG. 23, a power module 600 includes a base plate 1, an insulating substrate 2, power semiconductor elements 3 each functioning as a semiconductor element, bonding wires 4, terminals 5, a case 6 functioning as a case member, a lid 7 functioning as a lid member, silicone gel 8 which is sealing resin, a pressing plate 9, springs 14 functioning as elastic members, and solders 11 and 12.

The pressing plate 9 is disposed in close contact with a top face (upper face) of the silicone gel 8. Further, the lid 7 is disposed at a top portion of the case 6. The lid 7 is fixed to the case with adhesive (not illustrated) or screws (not illustrated).

The multiple springs 14 are fixed on the lower side of the lid 7 in the direction toward the pressing plate 9. Here, S-shaped springs are used for the springs 14.

The configuration of other components are the same as in Embodiment 1.

In the power module 600 described above, when the temperature of the power module 600 becomes lower, the pressing plate 9 is pulled down toward the base plate 1 by the thermal shrinkage of the silicone gel 8. At this time, because of being fixed neither to the case 6 nor to the lid 7, the pressing plate 9 can curve in a convex shape toward the lower side (the side of the base plate 1) according to the thermal shrinkage of the silicone gel 8. As the result, the silicone gel 8 generates almost no thermal stress, preventing the internal stress of the silicone gel 8 from becoming tensile stress. Therefore, even when the temperature of the power module 600 becomes lower, the growth of bubbles and detachments can be suppressed to suppress the detachments of the insulating substrate 2 from the silicone gel 8, consequently suppressing the insulation deterioration of the power module.

When the temperature of the power module 600 becomes higher, the pressing plate 9 is pushed up toward the lid 7 by the thermal expansion of the silicone gel 8. In this situation, when the pressing plate 9 touches the springs 14 disposed on the lid 7 and is pushed upward until the repulsive force of the springs exceeds the expansion force of the gel, because the lid 7 is fixed to the case 6, the pressing plate 9 cannot move any further in the direction toward the lid 7, so that the position of the pressing plate 9 gets fixed there. Then, the silicone gel 8 becomes unable to thermally expand any more, and the internal stress of the silicone gel 8 becomes compressive stress. Because the internal stress of the silicone gel 8 becomes compressive stress, even when the temperature of the power module 600 becomes higher, the growth of bubbles and detachments can be suppressed, consequently suppressing the insulation deterioration of the power module.

In Embodiment 6, multiple springs 14 are provided. The number of the springs 14, however, may be one if a single spring 14 can prevent the pressing plate 9 from ascending. The number of the springs 14 and the arrangement intervals are properly determined so that the warpage of the pressing plate 9 does not cause a problem.

Although S-shaped springs are used for the springs 14 in Embodiment 6, the type of the springs, however, is not limited to the S-shaped springs, but a spring with repulsive force such as a coil spring or a leaf spring can be used.

In Embodiment 6, the springs 14 are fixed on the lid 7. Instead, the springs 14 may be fixed on the upper side of the pressing plate so as to be directed toward the lid 7. If the springs 14 are disposed between the lid 7 and the pressing plate 9, the same effect can be obtained.

In the power module 600 configured as described above, the pressing plate is disposed between the sealing resin and the lid so as to be in close contact with the sealing resin, which thereby makes it possible to suppress the growth of bubbles and detachments caused by stress changes due to the sealing resin's expansion and shrinkage according to temperature changes of the power module 600. As the result, detachment between the sealing resin and the insulating substrate can be suppressed, which leads to improvement of the insulation reliability of the power module.

Because the springs 14 are disposed, on the lid 7, uniform compressive stress can be generated against the silicone gal 8 by the elasticity of the springs 14.

Embodiment 7

Embodiment 7 is different from Embodiments 1 to 6 in that the pressing plate 9 is a heavy object. Even in the case where the heavy pressing plate 9 is a heavy object, it is possible to suppress the growth of bubbles and detachments caused by stress changes due to the sealing resin's expansion and shrinkage. As the result, detachment between the sealing resin and the insulating substrate can be suppressed, which leads to improvement of the insulation reliability of the power module.

The heavy pressing plate 9 here is made of Cu or Cu alloy. The configuration of other components are the same as in Embodiment 1.

With this configuration, the downward pressing force applied from the heavy pressing plate 9 all the time to the upper face of the silicone gel 8 further increases the internal compressive stress of the silicone gel 8. Therefore, even when the temperature of the power module 100 becomes higher, the compressive stress continues to be generated in the silicone gel 8, so the growth of bubbles and detachments can be suppressed to suppress the detachments of the insulating substrate 2 from the silicone gel 8, consequently suppressing the insulation deterioration of the power module.

Note that a heavy object here is an object (a pressing plate 9) formed from a material with suitable quality, which can generate, with its self-weight, compressive stress in the silicone gel 8 toward the insulating substrate 2 when disposed on the upper face of the silicone gel 8.

The pressing plate 9 described above is made of Cu or Cu alloy. The material, however is not limited to these. Materials with higher density than the silicone gel 8 may be used. The metals such, as Al, Al alloy Fe or Fe alloy are suitable. A composite member of these metals, or of these metals and resin may be used.

In the power module 100 configured as described above, the heavy pressing plate is disposed between the sealing resin and the lid so as to be in close contact with the sealing resin, which thereby makes it possible to suppress the growth of bubbles and detachments caused by stress changes due to the sealing resin's expansion and shrinkage according to temperature changes of the power module 100. As the result, detachment between the sealing resin and the insulating substrate can be suppressed, which leads to improvement of the insulation reliability of the power module.

Even when the heavy pressing plate is applied to any structure of the power modules 200, 300, 400, 500, and 600, the same effect can be obtained.

DESCRIPTION OF SYMBOLS

1: base plate
2: insulating substrate
3: power semiconductor element
4: bonding wire
5: terminal
6: case
7: lid
8: silicone gel
9: pressing plate
10, 13: protrusion
11, 12: solder
14: spring
21: insulating layer
22: metal plate
23: metal plate
100, 200, 300, 400, 500, 600: power module

The invention claimed is:

1. A power module comprising:
   an insulating substrate having a first face;
   a semiconductor element disposed on the first face of the insulating substrate;
   a base plate joined to a second face of the insulating substrate;
   a case surrounding the insulating substrate and being in contact with a face of the base plate, that is joined to the second face of the insulating substrate;
   sealing resin filling a region surrounded by the base plate and the case to seal the insulating substrate;
   a pressing plate having a first face in contact with only an opposite face of the sealing resin with respect to the first face of the insulating substrate; and
   a lid facing a second face of the pressing plate that is opposite the first face of the pressing plate, the lid being fixed to the case at a position to prevent the pressing plate from ascending,
   wherein the lid has a first protrusion on its face opposite to the pressing plate, and
   wherein the pressing plate is connected neither to the case nor to the lid when a temperature of the power module is lower than 150 degrees C.

2. The power module according to claim 1, wherein the pressing plate has a second protrusion on its face opposite to the lid.

3. The power module according to claim 1, wherein the pressing plate has a second protrusion on its face opposite to the lid.

4. The power module according to claim 1, wherein the pressing plate has a second protrusion on its face opposite to the lid, and the second protrusion and the first protrusion are disposed opposite to each other.

5. The power module according to claim 1, wherein the first protrusion is a spring.

6. The power module according to claim 1, wherein the pressing plate is an object denser than the sealing resin.

7. The power module according to claim 2, wherein the pressing plate is an object denser than the sealing resin.

8. The power module according to claim 3, wherein the pressing plate is an object denser than the sealing resin.

9. The power module according to claim 4, wherein the pressing plate is an object denser than the sealing resin.

10. The power module according to claim 5, wherein the pressing plate is an object denser than the sealing resin.

11. The power module according to claim 1, wherein:
    a compressive stress exists due to the sealing resin when heat is supplied to the sealing resin to suppress a detachment between the sealing resin and the insulating substrate.

12. The power module according to claim 1, further comprising:
    a gap between an inner surface of the case and a side surface of the pressing plate.

13. The power module according to claim 12, wherein:
    a portion of the sealing resin directly faces the lid through the gap.

* * * * *